(12) United States Patent
Kojima et al.

(10) Patent No.: US 8,907,357 B2
(45) Date of Patent: Dec. 9, 2014

(54) LIGHT EMITTING MODULE

(75) Inventors: Akihiro Kojima, Kanagawa-ken (JP);
Hideto Furuyama, Kanagawa-ken (JP);
Miyoko Shimada, Kanagawa-ken (JP);
Yosuke Akimoto, Kanagawa-ken (JP);
Hideyuki Tomizawa, Gunma-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/597,055

(22) Filed: Aug. 28, 2012

(65) Prior Publication Data

US 2013/0285077 A1    Oct. 31, 2013

(30) Foreign Application Priority Data

Apr. 27, 2012  (JP) ................. 2012-103030

(51) Int. Cl.
*H01L 29/18*    (2006.01)
(52) U.S. Cl.
USPC .. 257/88; 257/72; 257/E33.061; 257/E27.133
(58) Field of Classification Search
CPC .... H01L 25/0753; H01L 33/62; H01L 27/153
USPC ........................ 257/88, 72, E33.061, E27.133
See application file for complete search history.

(56) References Cited

U.S. PATENT DOCUMENTS

| | | | |
|---|---|---|---|
| 8,110,421 B2 | 2/2012 | Sugizaki et al. | |
| 2009/0054568 A1* | 2/2009 | Uejima et al. | 524/147 |
| 2009/0321771 A1* | 12/2009 | Hattori et al. | 257/98 |
| 2010/0148198 A1 | 6/2010 | Sugizaki et al. | |
| 2011/0006316 A1* | 1/2011 | Ing et al. | 257/89 |
| 2012/0097972 A1 | 4/2012 | Sugizaki et al. | |

FOREIGN PATENT DOCUMENTS

| | | |
|---|---|---|
| JP | 2009-200273 | 9/2009 |
| JP | 2010-129615 | 6/2010 |

* cited by examiner

*Primary Examiner* — Dale E Page
(74) *Attorney, Agent, or Firm* — Patterson & Sheridan, LLP

(57) ABSTRACT

According to one embodiment, a light emitting module includes a mounting substrate, a plurality of light emitting chips, a transparent layer, and a phosphor layer. The transparent layer is provided between the plurality of light emitting chips on the mounting face and on the light emitting chip. The transparent layer has a first transparent body and a scattering agent dispersed at least in the first transparent body between the plurality of light emitting chips. The scattering agent has a different refraction index from a refraction index of the first transparent body. The phosphor layer is provided on the transparent layer. The light emitting chip includes a semiconductor layer, a p-side electrode, an n-side electrode, a p-side external terminal, and an n-side external terminal.

19 Claims, 15 Drawing Sheets

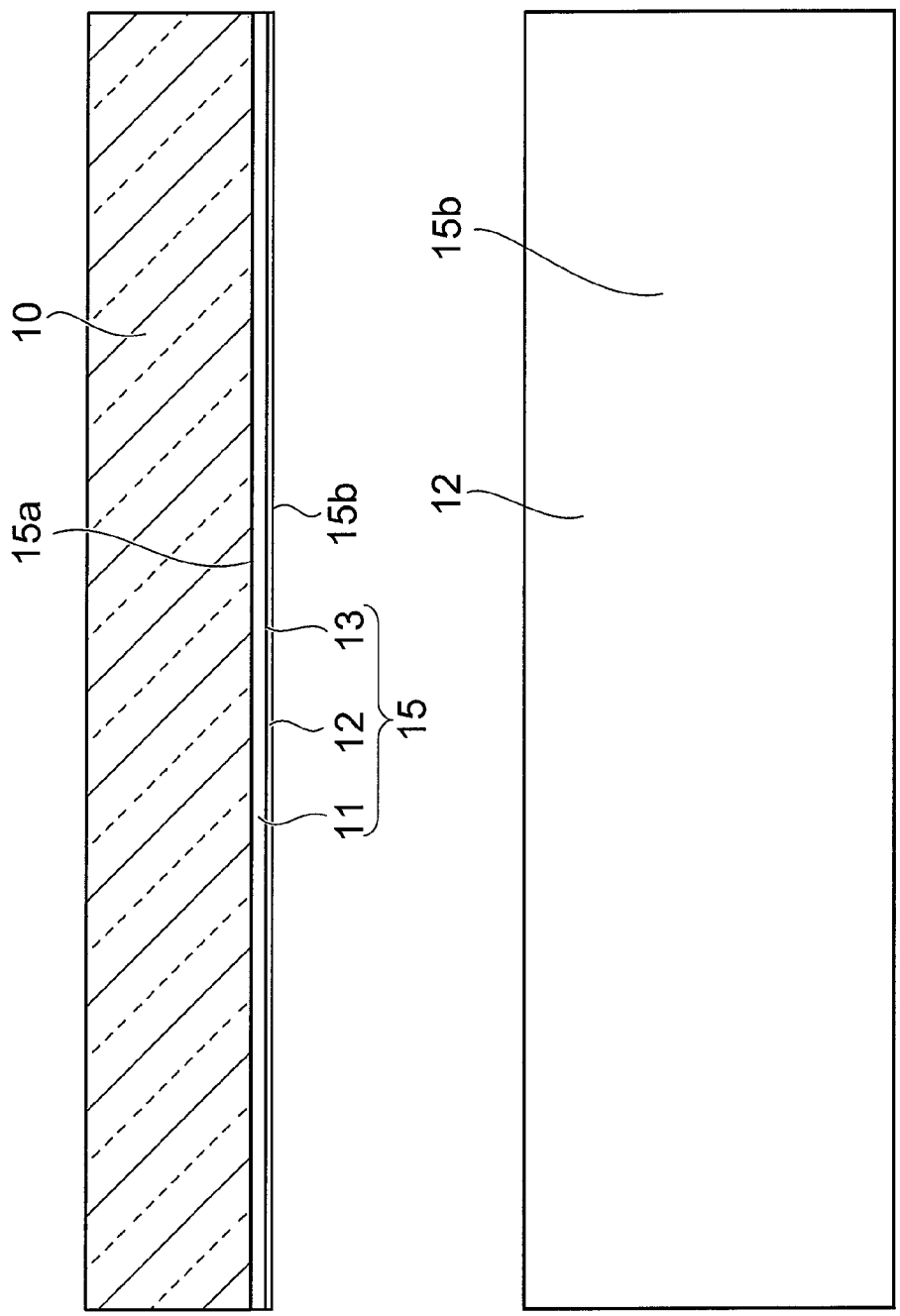

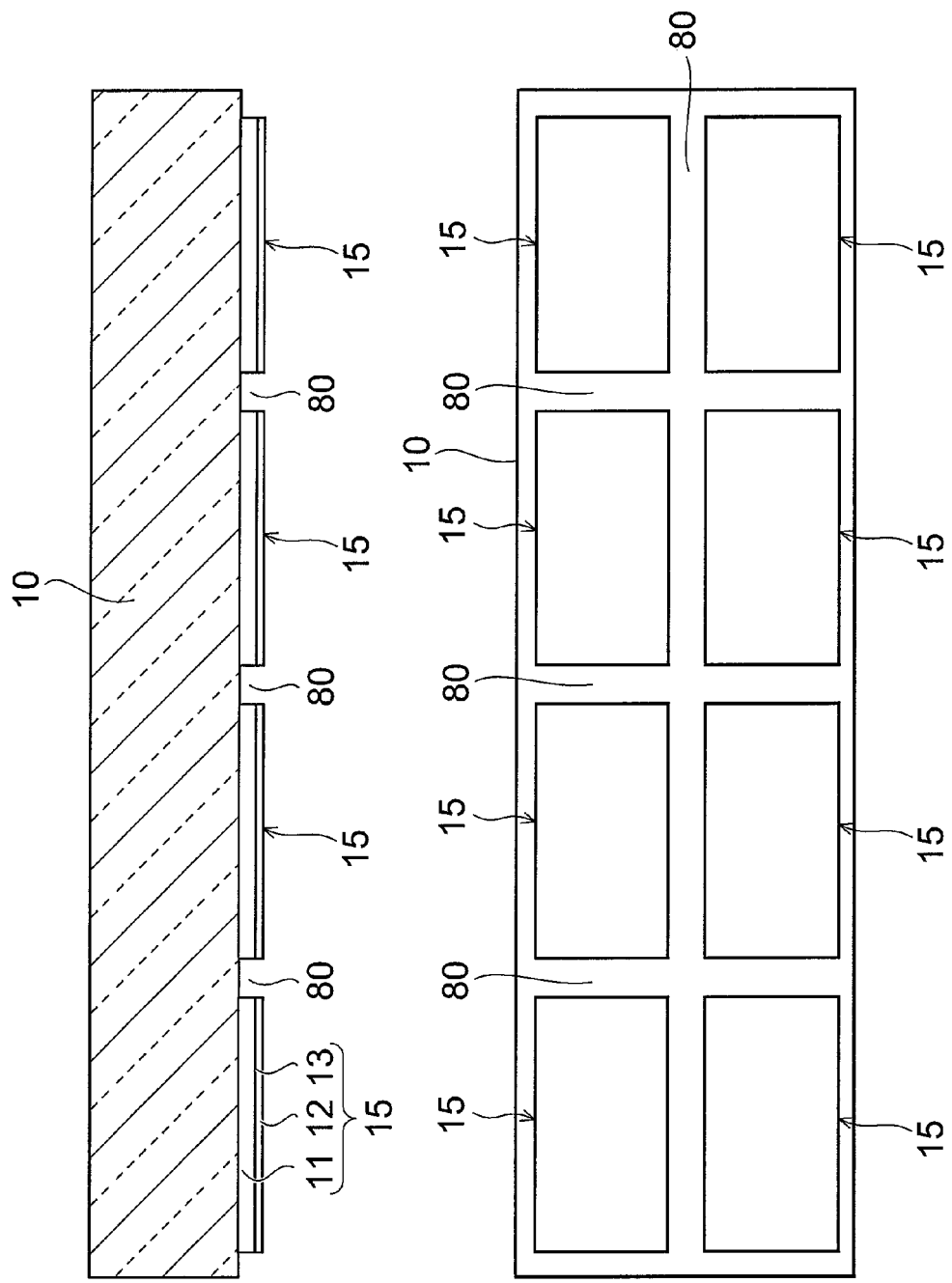

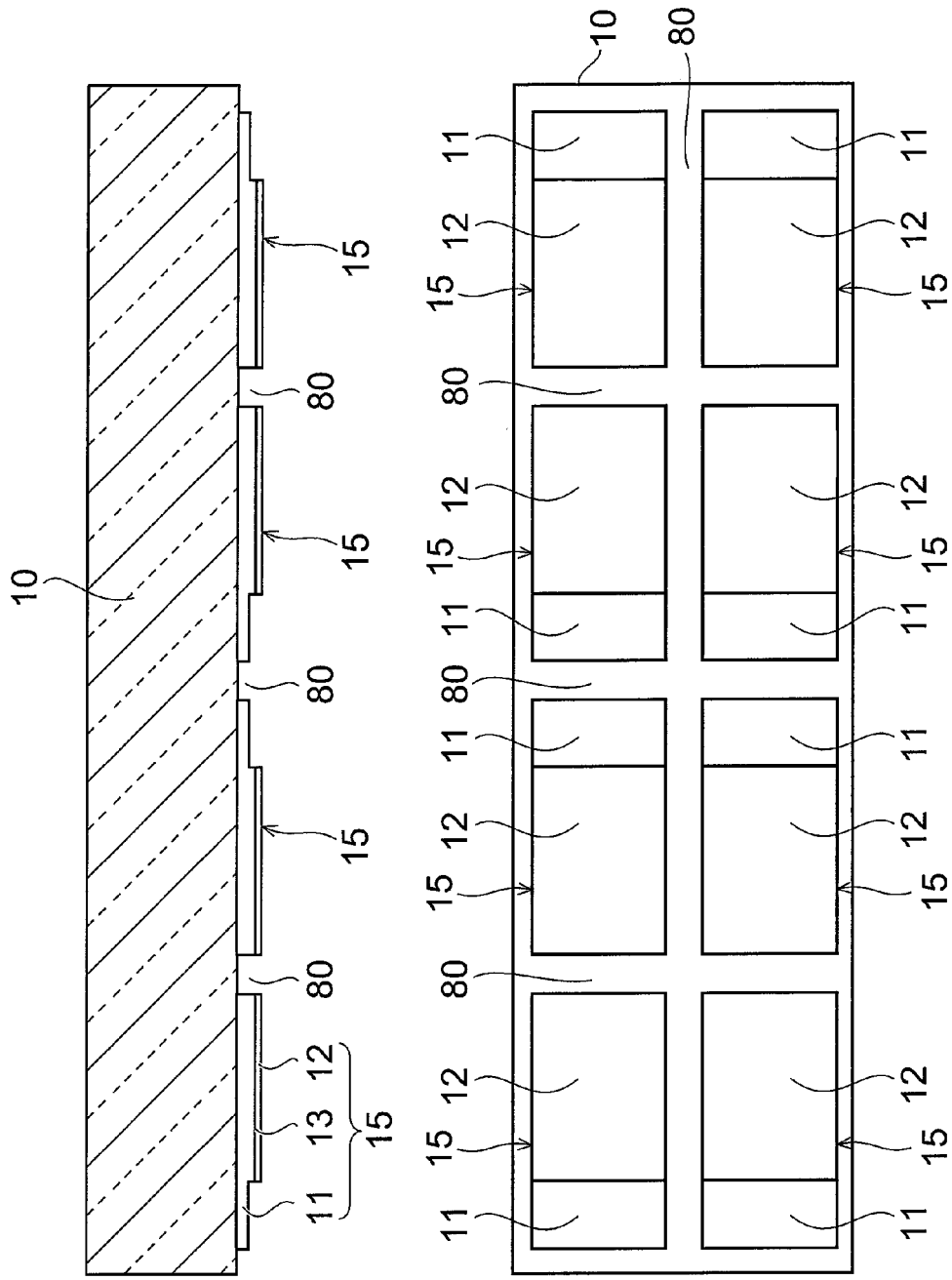

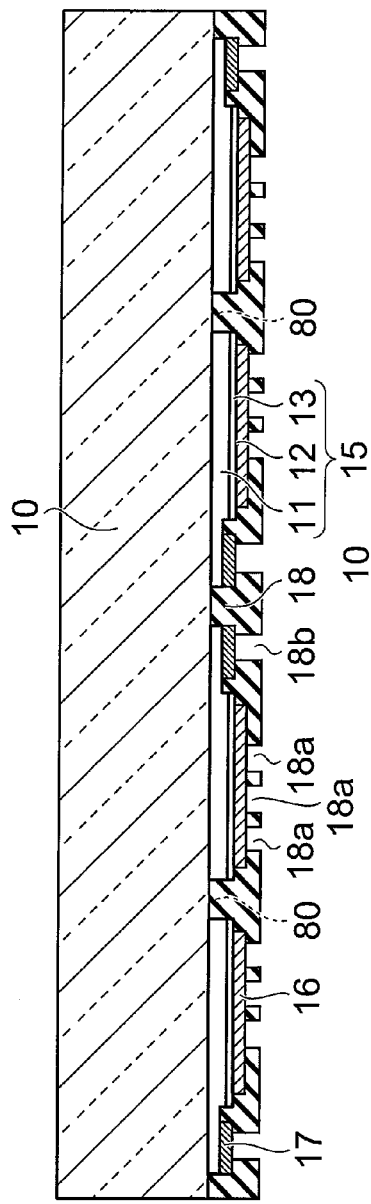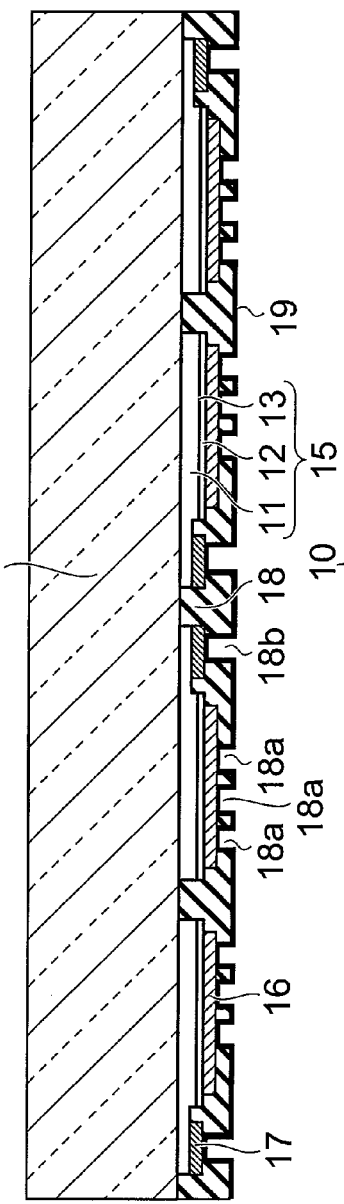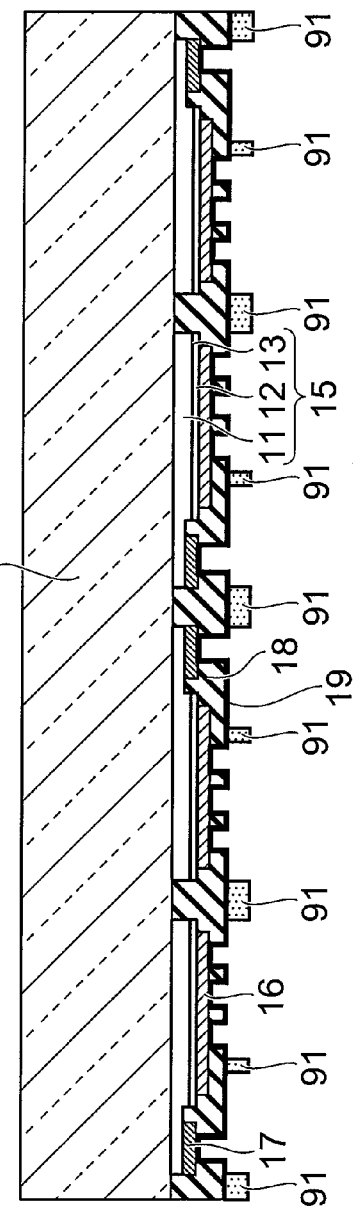
FIG. 8A
FIG. 8B
FIG. 8C

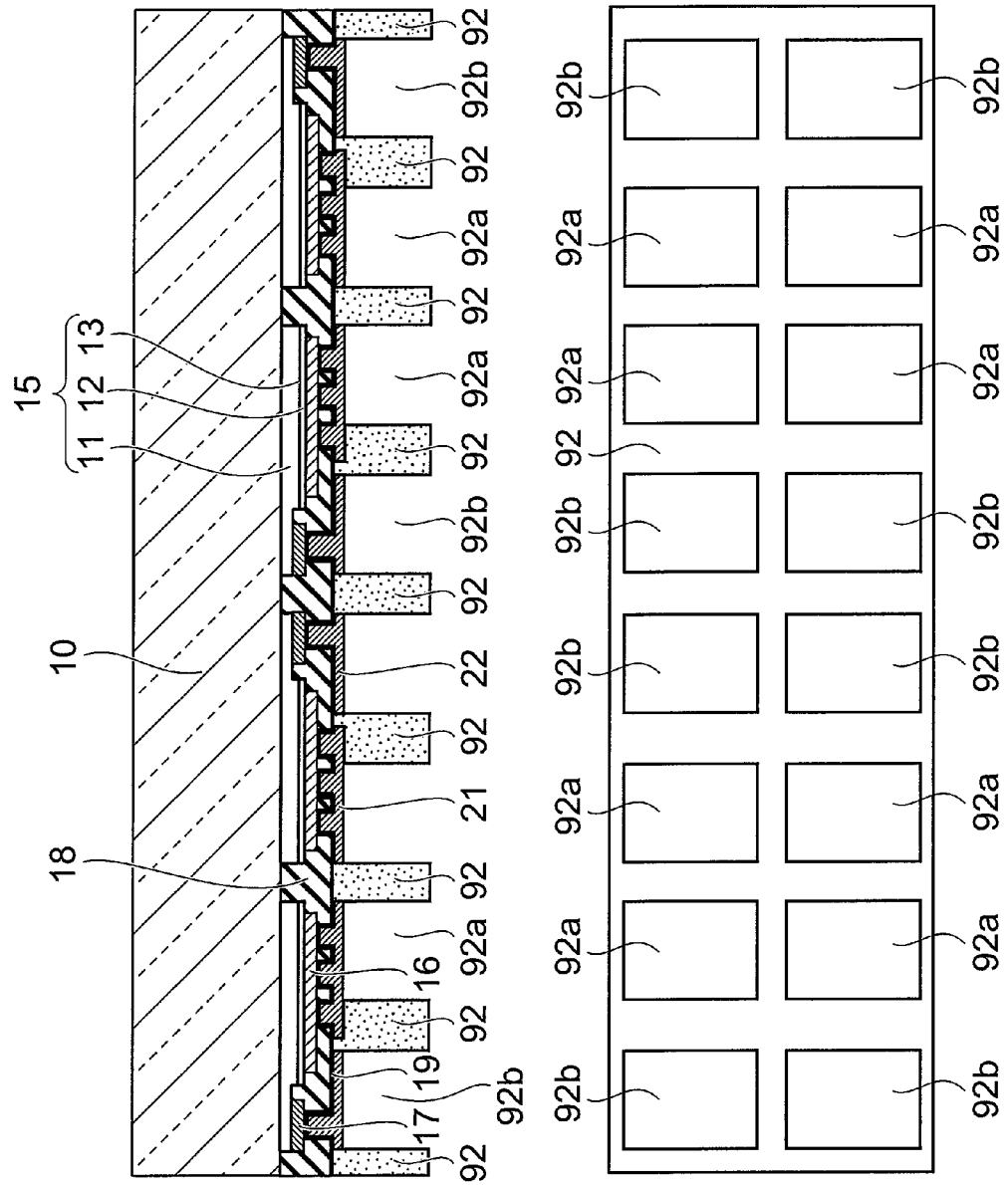

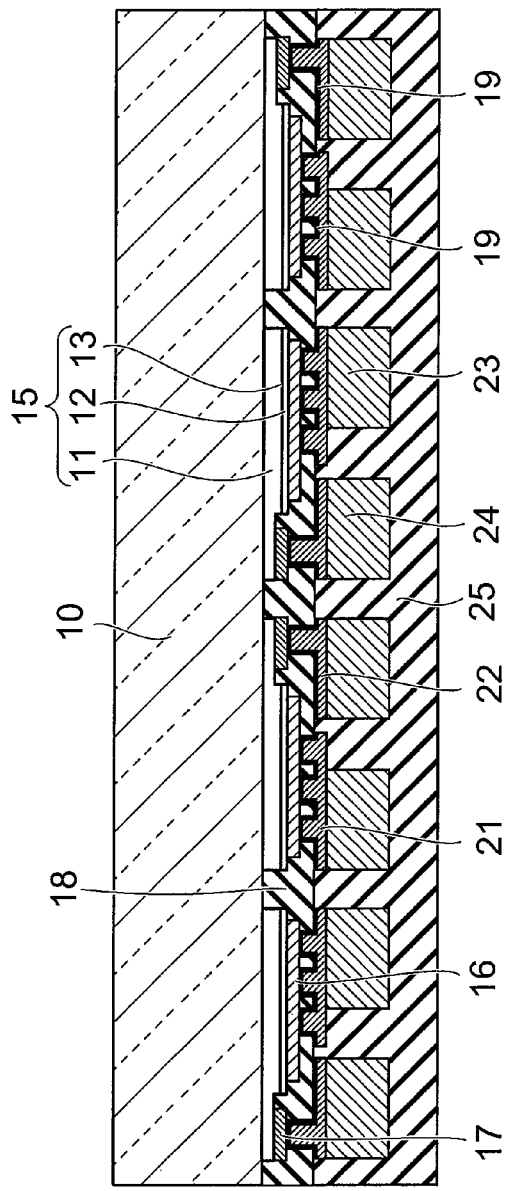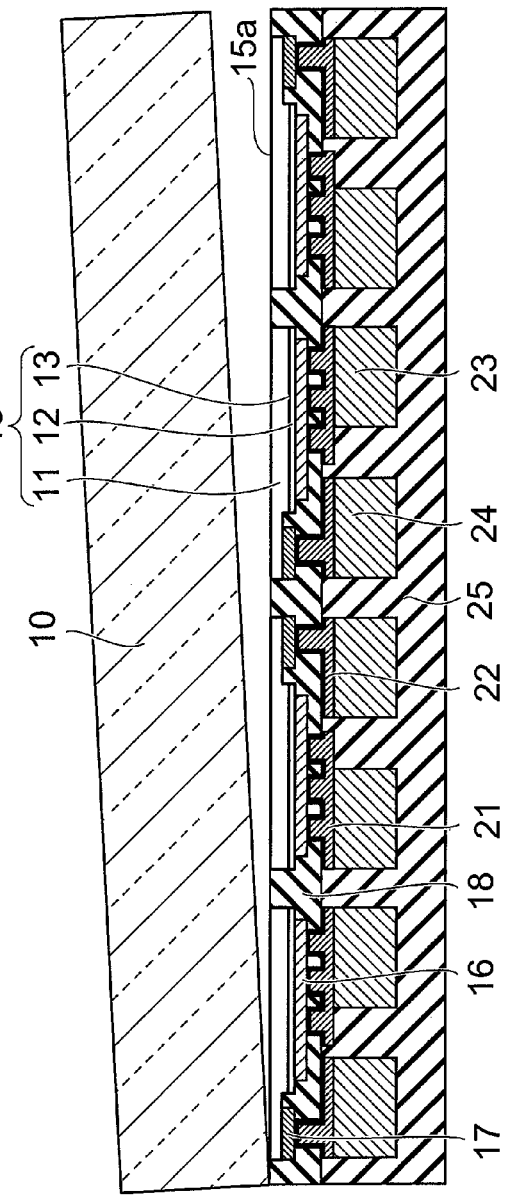
FIG. 13A
FIG. 13B

LIGHT EMITTING MODULE

CROSS-REFERENCE TO RELATED APPLICATION

This application is based upon and claims the benefit of priority from Japanese Patent Application No. 2012-103030, filed on Apr. 27, 2012; the entire contents of which are incorporated herein by reference.

FIELD

Embodiments described herein relate generally to a light emitting module.

BACKGROUND

In a light emitting module in which a plurality of light emitting elements of flip chip configuration are mounted on a mounting substrate, and a plurality of light emitting elements are covered by a phosphor layer, if the phosphor layer is insufficiently filled in a space between a plurality of light emitting elements, an irregular color may be caused.

BRIEF DESCRIPTION OF THE DRAWINGS

FIGS. 4A to 14B are schematic views showing a method for manufacturing the light emitting module of the embodiment.

DETAILED DESCRIPTION

Figure 1A:
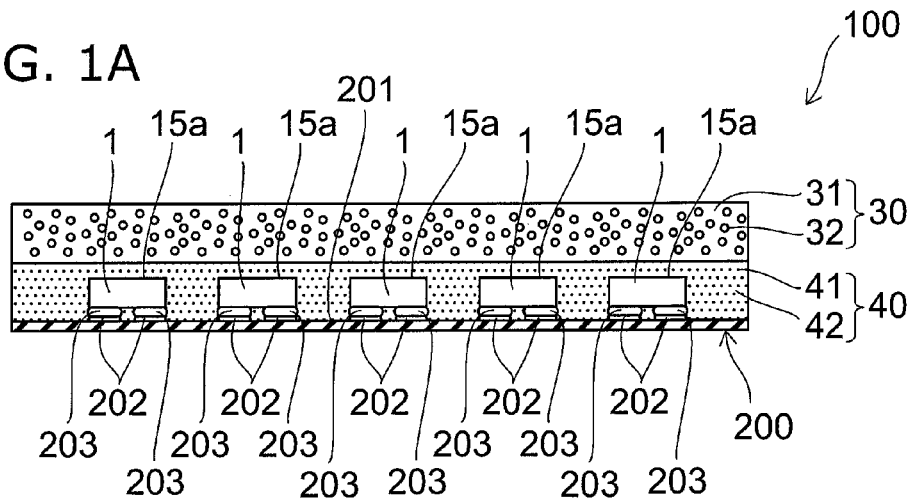
FIGS. 1A to 1C are schematic cross-sectional views of a light emitting module of an embodiment.

According to one embodiment, a light emitting module includes a mounting, substrate, a plurality of light emitting chips, a transparent layer, and a phosphor layer. The mounting substrate has a mounting face, and a pad provided on the mounting face. The plurality of light emitting chips is mounted on the mounting face so as to be spaced from each other. The transparent layer is provided between the plurality of light emitting chips on the mounting face and on the light emitting chip. The transparent layer does not include a phosphor. The transparent layer has a first transparent body and a scattering agent dispersed at least in the first transparent body between the plurality of light emitting chips. The scattering agent has a different refraction index from a refraction index of the first transparent body. The phosphor layer is provided on the transparent layer. The phosphor layer has a second transparent body and a phosphor dispersed into the second transparent body. The light emitting chip includes a semiconductor layer, a p-side electrode, an n-side electrode, a p-side external terminal, and an n-side external terminal. The semiconductor layer has a first face, a second face opposite to the first face, and a light emitting layer. The p-side electrode is provided on the second face in a region including the light emitting layer. The n-side electrode is provided on the second face in a region not including the light emitting layer. The p-side external terminal is provided between the p-side electrode and the pad, and is electrically connected to the p-side electrode and the pad. The n-side external terminal is provided between the n-side electrode and the pad, and is electrically connected to the n-side electrode and the pad.

A description will be given below of an embodiment with reference to the accompanying drawings. In this case, in each of the drawings, the same reference numerals are denoted to the same elements.

FIG. 1A is a schematic cross sectional view of a light emitting module 100 of the embodiment.

The light emitting module 100 of the embodiment is provided with a mounting substrate 200, a plurality of semiconductor light emitting chips (which may be, hereinafter, referred simply to as a light emitting chip or a chip) 1 which are mounted on the mounting substrate 200, a transparent layer 40, and a phosphor layer 30.

The mounting substrate 200 has a substrate, for example, having a resin substrate or a ceramic substrate as a base, a pad 202 which is provided in a mounting face 201 serving as one face of the substrate, and a interconnection pattern (not illustrated) which is provided on the mounting face 201 and is connected to the pad 202.

Alternatively, a metal plate which is excellent in a heat radiating property may be used as the base substrate of the mounting substrate 200. In this case, an insulating film is provided on the metal plate, and the pad 202 and the interconnection pattern are provided on the insulating film.

An outer shape of the light emitting chip 1 is formed, for example, as a rectangular parallelepiped shape. The light emitting chip 1 has a p-side external terminal 23a and an n-side external terminal 24a which are exposed on the same face, as mentioned later with reference to FIG. 3A. A face (a first face 15a) in an opposite side to the face in which the p-side external terminal 23a and the n-side external terminal 24a are exposed serves as a main pickup face of a light.

The light emitting chip 1 is mounted on the mounting face 201 in such a manner that the face to which the p-side external terminal 23a and the n-side external terminal 24a are exposed, is directed to the mounting face 201 of the mounting substrate 200, and the first face (the light pickup face) 15a is directed to an upward side of the mounting face 201.

The p-side external terminal 23a and the n-side external terminal 24a are bonded to the pad 202 via a bonding agent such as a solder 203 or the like. A light emitting layer 13 mentioned later of the light emitting chip 1 is electrically connected to a interconnection pattern of the mounting substrate 200 via the pad 202, the solder 203, the p-side external terminal 23a and the n-side external terminal 24a.

A plurality of light emitting chips 1 are mounted on the mounting face 201 so as to be spaced from each other. Further, the transparent layer 40 is provided between a plurality of light emitting chips 1 on the mounting face 201 and on the light emitting chip 1.

The transparent layer 40 has a first transparent body 41, and a plurality of granular scattering agents 42 which are scattered into the first transparent body 41. The transparent layer 40 does not include a phosphor.

The first transparent body 41 has a transparency with respect to a luminescent light of the light emitting chip 1 (a luminescent light of the light emitting layer 13), and is a transparent resin, for example, a silicone resin, an epoxy resin or the like.

The scattering agent 42 has a refraction index which is different from the first transparent body 41, and is a fine particle, for example, a silicon oxide, a titanium oxide or the like. An outgoing light from the light emitting chip 1 is scattered by the scattering agent 42 in the transparent layer 40 as mentioned below.

A top face of the transparent layer 40 is a flat face, and the phosphor layer 30 is provided on the top face. The phosphor layer 30 has a second transparent body 31, and a plurality of granular fluorescent bodies 32 which are scattered into the second transparent body 31.

The second transparent body 31 has a transparency with respect to the luminescent light of the light emitting chip 1, and is configured, for example, by a silicone resin, an acrylic resin, a phenyl resin or the like.

The phosphor 32 absorbs the luminescent light (an excited light) so as to emit a wavelength converting light. Accordingly, the light emitting module 100 can emit a mixed light of the luminescent light of the light emitting chip 1 and the wavelength converting light of the phosphor 32.

For example, if the phosphor 32 is a yellow phosphor which emits a yellow light, a white color or a lamp color can be obtained as a mixed color of a blue color of the light emitting layer 13 serving as a GaN group material, and a yellow light serving as the wavelength converting light in the phosphor 32. In this case, the phosphor layer 30 may be configured such as to include plural kinds of phosphors (for example, a red phosphor emitting a red color, and a green phosphor emitting a green light).

The transparent layer 40 which does not include the phosphor is filled between a plurality of luminous chips 1, and the phosphor layer 30 is not provided. The transparent layer 40 comes into contact with a side face and a top face of the light emitting chip 1, and covers the side face and the top face of the light emitting chip 1.

Next, a description will be given of the light emitting chip 1.

Figure 3A:
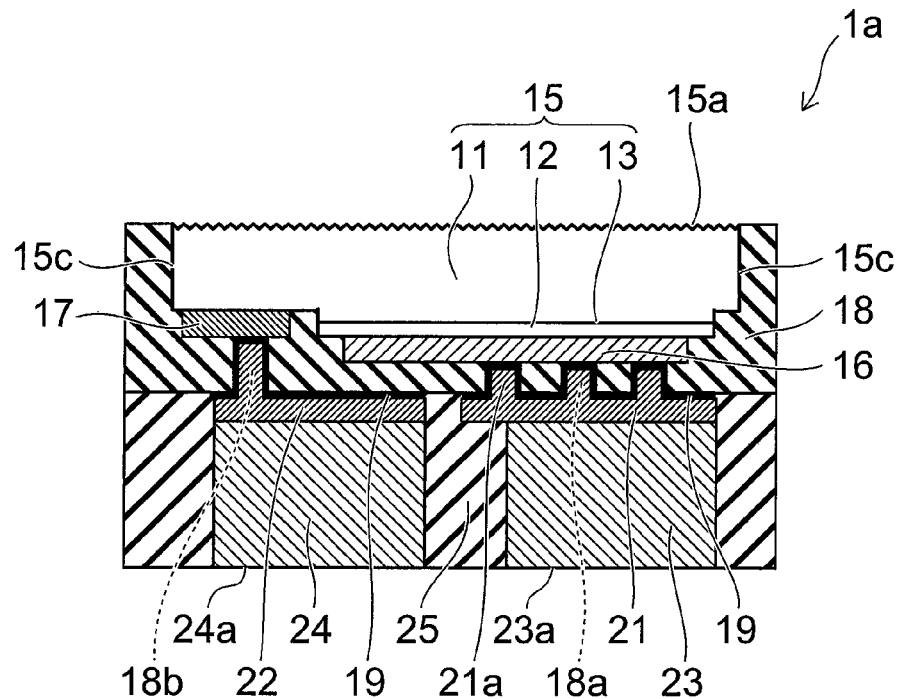
FIGS. 3A and 3B are schematic cross-sectional views of the light emitting chip of the embodiment.

FIG. 3A is a schematic cross sectional view of a light emitting chip is corresponding to the light emitting chip 1 in FIG. 1A.

As the light emitting chip 1 shown in FIGS. 1A and 1B, for example, there can be used any one of the light emitting chip 1a shown in FIG. 3A, a light emitting chip 1b shown in FIG. 3B mentioned later, a light emitting chip 1c shown in FIG. 15A, and a light emitting chip shown in FIG. 15B.

The light emitting chip 1a shown in FIG. 3A has a semiconductor layer 15 which includes the light emitting layer 13. Further, the semiconductor layer 15 has a first face 15a, and a second face in an opposite side thereto. An electrode and a interconnection portion are provided in the second face side, and the light is emitted mainly from the first face 15a in which the electrode and the interconnection portion are not provided, to an outer portion of the light emitting chip 1a.

The semiconductor layer 15 has a first semiconductor layer 11 and a second semiconductor layer 12. The first semiconductor layer 11 and the second semiconductor layer 12 include, for example, a gallium nitride. The first semiconductor layer 11 includes, for example, a foundation buffer layer, an n-type GaN layer and the like. The second semiconductor layer 12 includes a p-type GaN layer, the light emitting layer (an active layer) 13 and the like. The light emitting layer 13 can employ a material which emits a blue, violet, lavender or ultraviolet light or the like.

The second face of the semiconductor layer 15 is processed as a concave and convex shape, and the convex portion includes the light emitting layer 13. A p-side electrode 16 is provided on a surface of the second semiconductor layer 12 serving as a surface of the convex portion. In other words, the p-side electrode 16 is provided in the second face in a region having the light emitting layer 13.

A region which does not include the light emitting layer 13 is provided in a sideward of the convex portion in the second face of the semiconductor layer 15, and an n-side electrode 17 is provided on the surface of the first semiconductor layer 11 in the region. In other words, the n-side electrode 17 is provided on the second face in the region which does not include the light emitting layer 13.

As shown in FIG. 6B, in the second face of the semiconductor layer 15, an area of the second semiconductor layer 12 which includes the light emitting layer 13 is wider than an area of the first semiconductor layer 11 which does not include the light emitting layer 13.

Figures 7A, 7B:
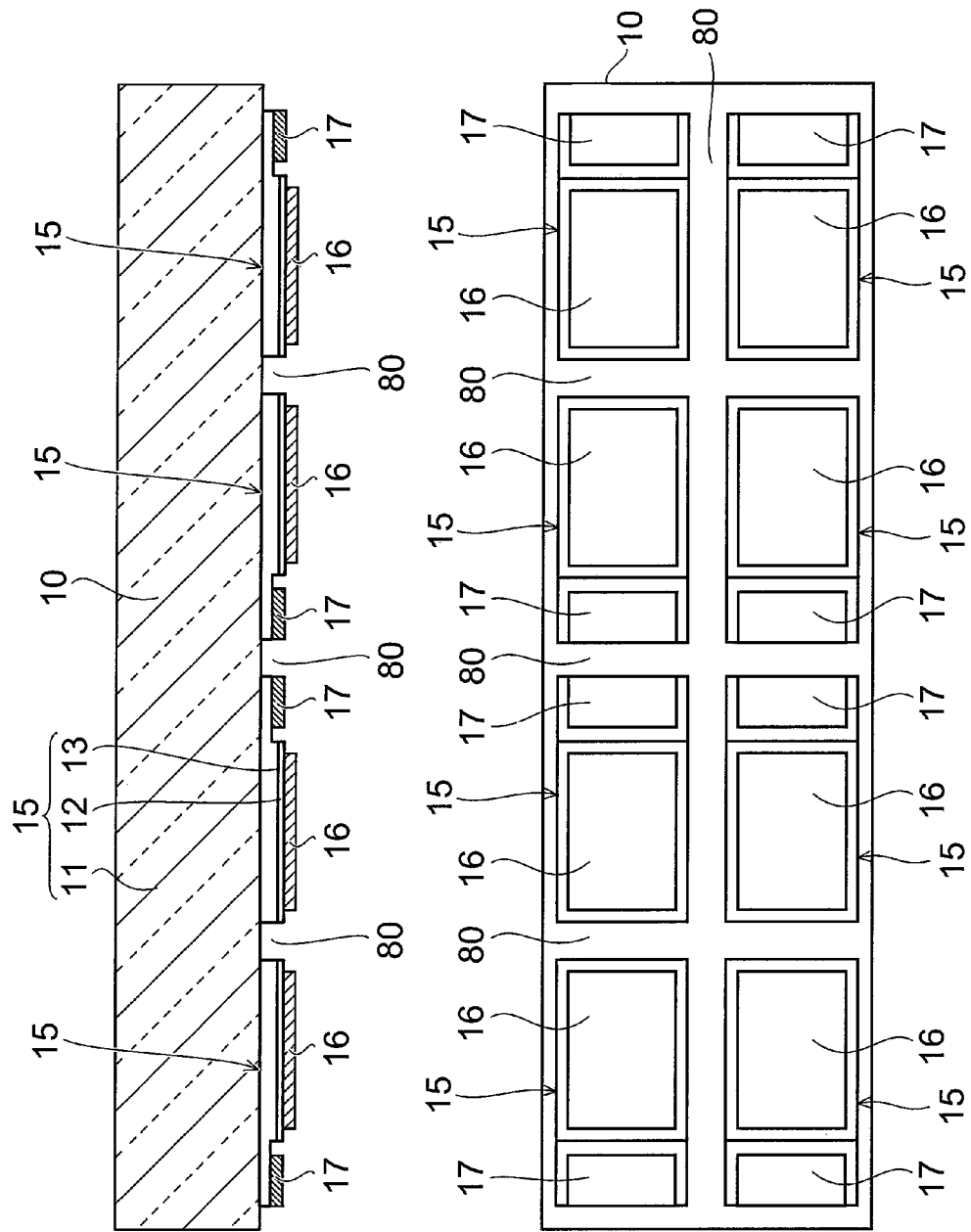

Further, as shown in FIG. 7B, in the semiconductor layer 15, an area in the p-side electrode 16 which is provided in the region including the light emitting layer 13 is wider than that in the n-side electrode 17 which is provided in the region which does not include the light emitting layer 13. Accordingly, the wide luminescent region can be obtained. In this case, a layout of the p-side electrode 16 and the n-side electrode 17 shown in FIG. 7B is only an example, and the layout is not limited to this.

A first insulating film (hereinafter, referred simply to as an insulating film) 18 is provided in a second face side of the semiconductor layer 15. The insulating film 18 covers the semiconductor layer 15, the p-side electrode 16 and the n-side electrode 17. Further, the insulating film 18 covers the side faces of the light emitting layer 13 and the second semiconductor layer 12 so as to protect.

In this case, a different insulating film (for example, a silicon oxide film) may be provided between the insulating film 18 and the semiconductor layer 15. The insulating layer 18 is made of a resin, for example, a polyimide or the like which is excellent in a patterning property of a fine opening. Alternatively, an inorganic film such as a silicon oxide film, a silicon nitride film or the like may be employed as the insulating film 18.

The insulating film 18 is not provided on the first face 15a of the semiconductor layer 15. The insulating film 18 covers a side face 15c which runs from the first face 15a in the semiconductor layer 15 so as to protect.

A p-side interconnection layer 21 and an n-side interconnection layer 22 are provided on a face in an opposite side to the second face of the semiconductor layer 15, in the insulating film 18 so as to be spaced from each other.

The p-side interconnection layer 21 is provided within a plurality of the first openings 18a which run into the p-side electrode 16 so as to be formed in the insulating film 18, and is electrically connected to the p-side electrode 16. The n-side interconnection layer 22 is provided within a second opening 18b which runs into the n-side electrode 17 so as to be formed in the insulating film 18, and is electrically connected to the n-side electrode 17.

A p-side metal pillar 23 is provided on a face in an opposite side to the p-side electrode 16 in the p-side interconnection layer 21. The metal film 19 which is used as the p-side interconnection layer 21, the p-side metal pillar 23 and a seed layer mentioned later configures the p-side interconnection portion in the embodiment.

An n-side metal pillar 24 is provided on a face in an opposite side to the n-side electrode 17 in the n-side interconnection layer 22. The metal film 19 which is used as the n-side interconnection layer 22, the n-side metal pillar 24 and a seed layer mentioned later configures the n-side interconnection portion in the embodiment.

For example, a resin layer 25 is stacked as the second insulating film on the insulating film 18. The resin layer 25 covers a periphery of the p-side interconnection portion and a periphery of the n-side interconnection portion. Further, the resin layer 25 is filled between the p-side metal pillar 23 and the n-side metal pillar 24.

A side face of the p-side metal pillar 23 and a side face of the n-side metal pillar 24 are covered by the resin layer 25. A face in an opposite side to the p-side interconnection layer 21 in the p-side metal pillar 23 is exposed from the resin layer 25, and serves as a p-side external terminal 23a. A face in an opposite side to the n-side interconnection layer 22 in the n-side metal pillar 24 is exposed from the resin layer 25, and serves as an n-side external terminal 24a.

A distance between the p-side external terminal 23a and the n-side external terminal 24a which are exposed on the same face (the lower face in FIG. 3A) in the resin layer 25 is larger than a distance between the p-side interconnection layer 21 and the n-side interconnection layer 22 on the insulating film 18. The p-side external terminal 23a and the n-side external terminal 24a are away so as to be spaced at a distance at which they are not short circuited with each other by a soldering or the like at a time of being mounted to the mounting substrate.

The p-side interconnection layer 21 can be moved close to the n-side interconnection layer 22 to a critical limit on a process, and an area of the p-side interconnection layer 21 can be widened. As a result, it is possible to achieve an enlargement of a contact area between the p-side interconnection layer 21 and the p-side electrode 16, and it is possible to improve a current distribution and a heat radiating performance.

An area at which the p-side interconnection layer 21 comes into contact with the p-side electrode 16 through a plurality of first openings 18a is larger than an area at which the n-side interconnection layer 22 comes into contact with the n-side electrode 17 through the second opening 18b. Accordingly, a current distribution to the light emitting layer 13 is improved, and a heat radiating performance of the heat of the light emitting layer 13 can be improved.

An area of the n-side interconnection layer 22 which expands on the insulating film 18 is larger than an area at which the n-side interconnection layer 22 comes into contact with the n-side electrode 17.

In accordance with the embodiment, it is possible to obtain a high light output by the light emitting layer 13 which is formed over a wider region than the n-side electrode 17. In this case, the n-side electrode 17 which is provided in the narrower region than the region including the light emitting layer 13 is drawn as the n-side interconnection layer 22 having a wider area to the mounting face side.

The first semiconductor layer 11 is electrically connected to the n-side metal pillar 24 having the n-side external terminal 24a via the n-side electrode 17, the metal film 19 and the n-side interconnection layer 22. The second semiconductor layer 12 including the light emitting layer 13 is electrically connected to the p-side metal pillar 23 having the p-side external terminal 23a via the p-side electrode 16, the metal film 19 and the p-side interconnection layer 21.

The p-side metal pillar 23 is thicker than the p-side interconnection layer 21, and the n-side metal pillar 24 is thicker than the n-side interconnection layer 22. The respective thicknesses of the p-side metal pillar 23, the n-side metal pillar 24 and the resin layer 25 are larger than the semiconductor layer 15. In this case, "thickness" here expresses a thickness in a vertical direction in FIG. 3A.

Further, the respective thicknesses of the p-side metal pillar 23 and the n-side metal pillar 24 are larger than a thickness of a stacked body which includes the semiconductor layer 15, the p-side electrode 16, the n-side electrode 17 and the insulating film 18. In this case, an aspect ration (a ratio of the thickness with respect to the plane size) of each of the metal pillars 23 and 24 is not limited to be not less than 1, but the ratio may be smaller than 1. In other words, the metal pillars 23 and 24 may be smaller its thickness than the plane size.

In accordance with the embodiment, even if a substrate 10 mentioned below which is used for forming the semiconductor layer 15 is removed, it is possible to stably support the semiconductor layer 15 by the p-side metal pillar 23, the n-side metal pillar 24 and the resin layer 25, and it is possible to enhance a mechanical strength of the light emitting chip 1a.

As the material of the p-side interconnection layer 21, the n-side interconnection layer 22, the p-side metal pillar 23 and the n-side metal pillar 24, a copper, a gold, a nickel, a silver and the like can be employed. Among them, if the copper is used, it is possible to obtain a good heat conductivity, a high metal migration resistance and an excellent adhesion with an insulating material.

The resin layer 25 reinforces the p-side metal pillar 23 and the n-side metal pillar 24. As the resin layer 25, a resin in which a coefficient of thermal expansion is equal to or similar to the mounting substrate is desired. As the resin layer as mentioned above, there can be listed up, for example, an epoxy resin, a silicone resin, a fluorine resin and the like.

Further, in a state in which the light emitting chip is mounted to a mounting substrate 200 shown in FIG. 1A via the p-side external terminal 23a and the n-side external terminal 24a, it is possible to reduce a stress applied to the semiconductor layer 15 via the solder 203 by being absorbed by the p-side metal pillar 23 and the n-side metal pillar 24.

The p-side interconnection portion including the p-side interconnection layer 21 and the p-side metal pillar 23 is connected to the p-side electrode 16 via a plurality of vias 21a which are provided within a plurality of first openings 18a and segmentized with each other. Accordingly, a high stress reducing effect by the p-side interconnection portion can be obtained.

Figure 3B:
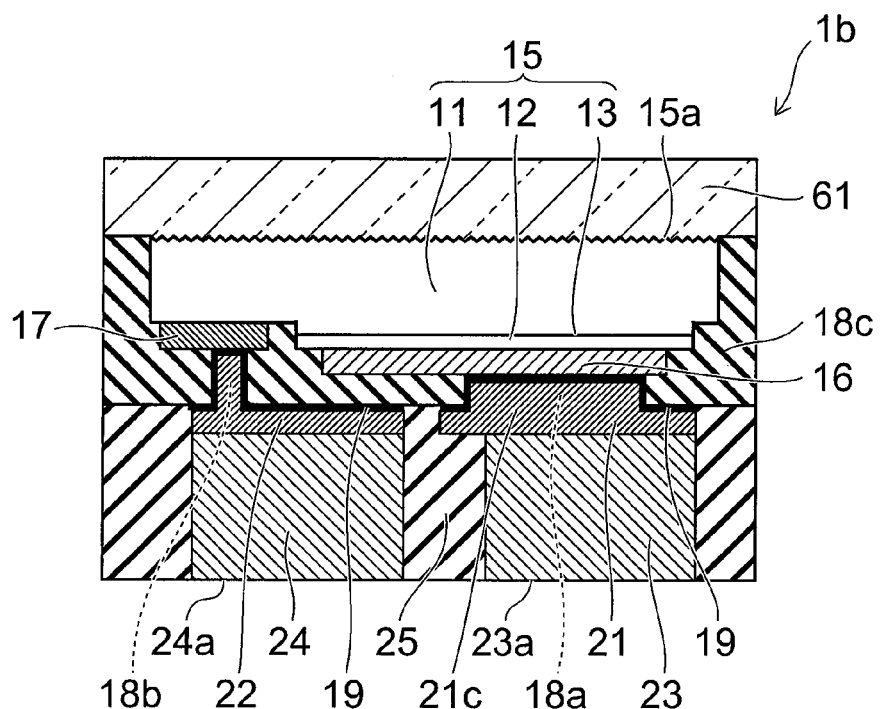

Alternatively, the p-side interconnection layer 21 may be connected to the p-side electrode 16 via a post 21c which has a larger plane size than the via 21a, and is provided within one large first opening 18a, such as the light emitting chip 1b shown in FIG. 3B. In this case, it is possible to improve a heat radiating performance of the light emitting layer 13 through the p-side electrode 16, the p-side interconnection layer 21 and the p-side metal pillar 23, each of which is made of a metal.

As mentioned later, the substrate 10 which is used at a time of forming the semiconductor layer 15 is removed from the first face 15a. Accordingly, it is possible to form the semiconductor luminescent apparatus 1 in a low back.

Fine concavities and convexities are formed on the first face 15a of the semiconductor layer 15. The concavities and convexities are formed, for example, by carrying out a wet etching (a frost process) using an alkali solution with respect to the first face 15a. It is possible to pick up the light entering into the first face 15a at various angles to an outer side of the first face 15a without reflecting every light, by providing the concavities and convexities on the first face 15a which is a main pickup face of the luminescent light of the light emitting layer 13.

Further, as shown in FIG. 3B, a transparent layer 61 having a transparency with respect to the luminescent light of the light emitting layer 13 may be provided on the first face 15a. The transparent layer 61 is configured, for example, by a silicone resin, an epoxy resin or the like which is excellent in a light transmittance in a visible light region.

Next, a description will be given of a manufacturing method of the light emitting chip 1a with reference to FIG. 4A to FIG. 14B. FIG. 4A to FIG. 14B express a partial region in a wafer state.

FIG. 4A shows a stacked body in which the first semiconductor layer 11 and the second semiconductor layer 12 are formed on a main face of the substrate 10 (a lower face in FIG. 4A). FIG. 4B corresponds to a bottom elevational view in FIG. 4A.

The first semiconductor layer 11 is formed on a main face of the substrate 10, and a second semiconductor layer 12 including the light emitting layer 13 is formed thereon. The first semiconductor layer 11 and the second semiconductor layer 12 which include a gallium nitride can be crystalline grown, for example, on a sapphire substrate in accordance with a metal organic chemical vapor deposition (MOCVD) method. Alternatively, a silicon substrate may be used as the substrate 10.

A face which comes into contact with the substrate 10 in the first semiconductor layer 11 is a first face 15a of the semiconductor layer 15, and a surface of the second semiconductor layer 12 is a second face 15b of the semiconductor layer 15.

Next, for example, in accordance with a reactive ion etching (RIE) method using a resist which is not illustrated, as shown in FIG. 5A and FIG. 5B corresponding to a bottom elevational view thereof, a groove 80 reaching the substrate 10 through the semiconductor layer 15 is formed. The groove 80 is formed, for example, as a grating shape on the substrate 10 in a wafer state, and the semiconductor layer 15 is separated into a plurality of chips on the substrate 10.

In this case, a process of separating the semiconductor layer 15 into a plurality of sections may be carried out after selectively removing the second semiconductor layer 12 mentioned later or after forming the electrode.

Next, for example, in accordance with the RIE method using the resist which is not illustrated, as shown in FIG. 6A and FIG. 6B corresponding to a bottom elevational view thereof, a part of the second semiconductor layer 12 is removed and a part of the first semiconductor layer 11 is exposed. A region to which the first semiconductor layer 11 is exposed does not include the light emitting layer 13.

Next, as shown in FIG. 7A and FIG. 7B corresponding to a bottom elevational view thereof, the p-side electrode 16 and the n-side electrode 17 are formed on the second face of the semiconductor layer 15. The p-side electrode 16 is formed on the surface of the second semiconductor layer 12. The n-side electrode 17 is formed on the exposed face of the first semiconductor layer 11.

The p-side electrode 16 and the n-side electrode 17 are formed, for example, in accordance with a sputter method, a vapor deposition method or the like. Either of the p-side electrode 16 or the n-side electrode 17 may be an electrode to be formed first, and may be simultaneously formed by the same material.

The p-side electrode 16 includes, for example, a silver, a silver alloy, an aluminum, an aluminum alloy or the like which has a reflecting property with respect to the luminescent light of the light emitting layer 13. Further, in order to prevent a sulfuration and an oxidation of the p-side electrode 16, a configuration including a metal protection film (a barrier metal) may be employed.

Further, for example, a silicon nitride film or a silicon oxide film may be formed as a passivation film on an end face (a side face) of the light emitting layer 13 or between the p-side electrode 16 and the n-side electrode 17, in accordance with a chemical vapor deposition (CVD) method. Further, an activation anneal or the like for obtaining an ohmic contact between each of the electrodes and the semiconductor layer or the like is executed as appropriate.

Next, a first opening 18a and a second opening 18b are selectively formed in the insulating film 18 by covering all the portion which is exposed onto the main face of the substrate 10 by the insulating film 18 shown in FIG. 8A, and thereafter patterning the insulating film 18 in accordance with a wet etching or the like. A plurality of first openings 18a are formed, and each of the first openings 18a reaches the p-side electrode 16. The second opening 18b reaches the n-side electrode 17.

As the insulating film 18, for example, an organic material such as a photosensitive polyimide, a benzocyclobutene or the like can be employed. In this case, an exposure and a development can be applied directly to the insulating film 18 without using any resist.

Alternatively, an inorganic film such as the silicon nitride film, the silicon oxide film or the like can be used as the insulating film 18. In the case that the insulating film 18 is the inorganic film, the first opening 18a and the second opening 18b are formed in accordance with an etching after patterning the resist which is formed on the insulating film 18.

Next, a metal film 19 is formed, as shown in FIG. 8B, on a surface of the insulating film 18, an inner wall (a side wall and a bottom portion) of the first opening 18a, and an inner wall (a side wall and a bottom portion) of the second opening 18b. The metal film 19 is used as a seed metal of a plating mentioned later.

The metal film 19 is formed, for example, in accordance with a sputtering method. The metal film 19 includes, for example, a stacked film of a titanium (Ti) and a copper (Cu) which are stacked in this order from the insulating film 18 side. Alternatively, an aluminum film may be used in place of the titanium film.

Next, as shown in FIG. 8C, a resist 91 is selectively formed on the metal film 19, and a Cu electrolyte plating using the metal film 19 as a current route is carried out.

Figure 9A:
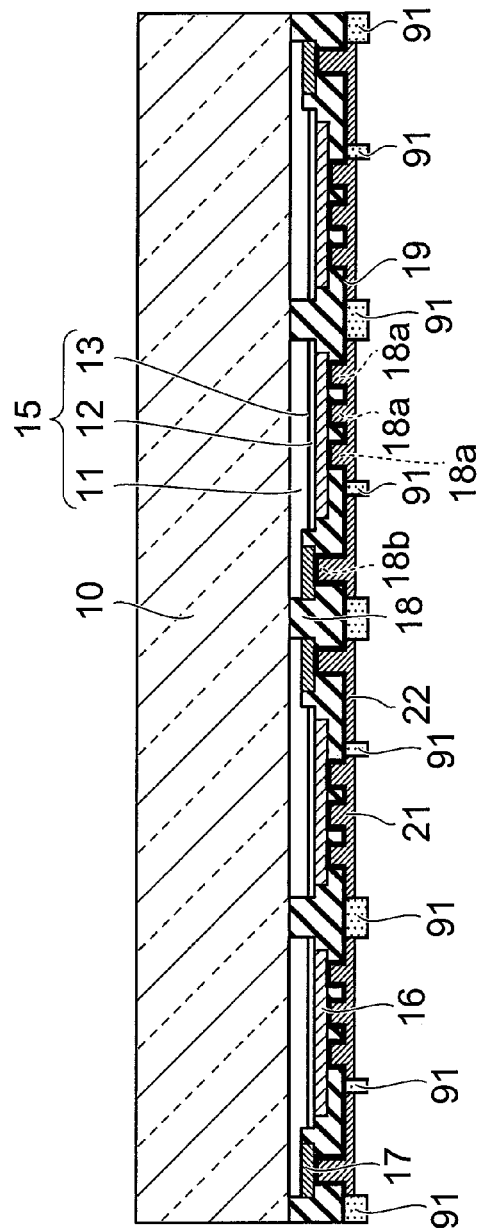
Figure 9B:
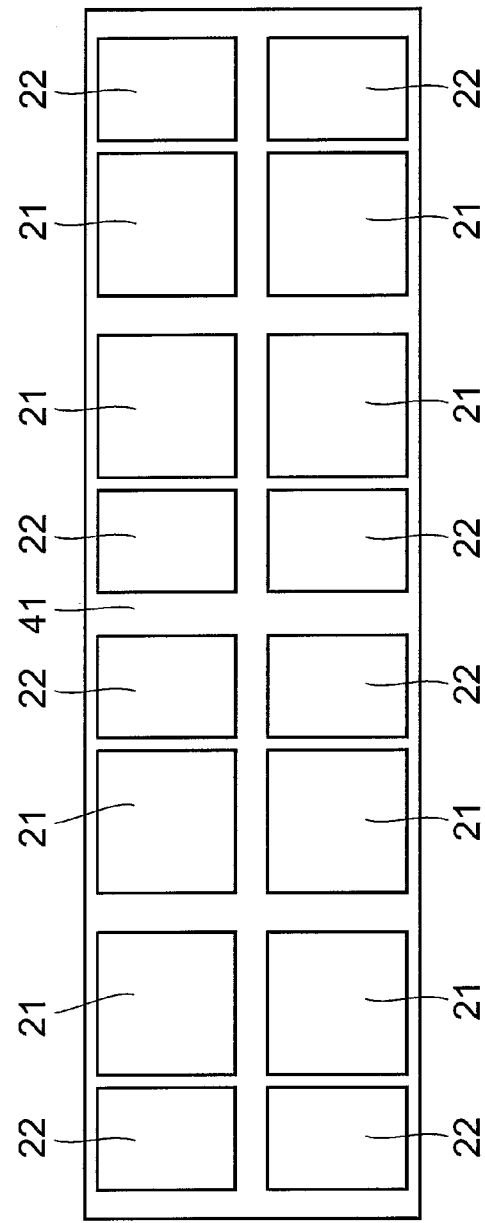

Accordingly, as shown in FIG. 9A and FIG. 9B corresponding to a bottom elevational view thereof, the p-side interconnection layer 21 and the n-side interconnection layer 22 are selectively formed on the metal film 19. The p-side interconnection layer 21 and the n-side interconnection layer 22 are simultaneously formed in accordance with the plating method, and are configured for example, by a cupper material.

The p-side interconnection layer 21 is formed within the first opening 18a, and is electrically connected to the p-side electrode 16 via the metal film 19. The n-side interconnection layer 22 is formed within the second opening 18b, and is electrically connected to the n-side electrode 17 via the metal film 19.

The resist 91 which is used for plating the p-side interconnection layer 21 and the n-side interconnection layer 22 is removed by using a solvent or an oxide plasma.

Next, as shown in FIG. 10A and FIG. 10B corresponding to a bottom elevational view thereof, a resist 92 for forming a metal pillar is formed. The resist 92 is thicker than the resist 91 mentioned above. In this case, the resist 91 may be left without being removed in the preceding process, and the resist 92 may be formed in an overlapping manner on the resist 91. A first opening 92a and a second opening 92b are formed in the resist 92.

Figures 11A, 11B:
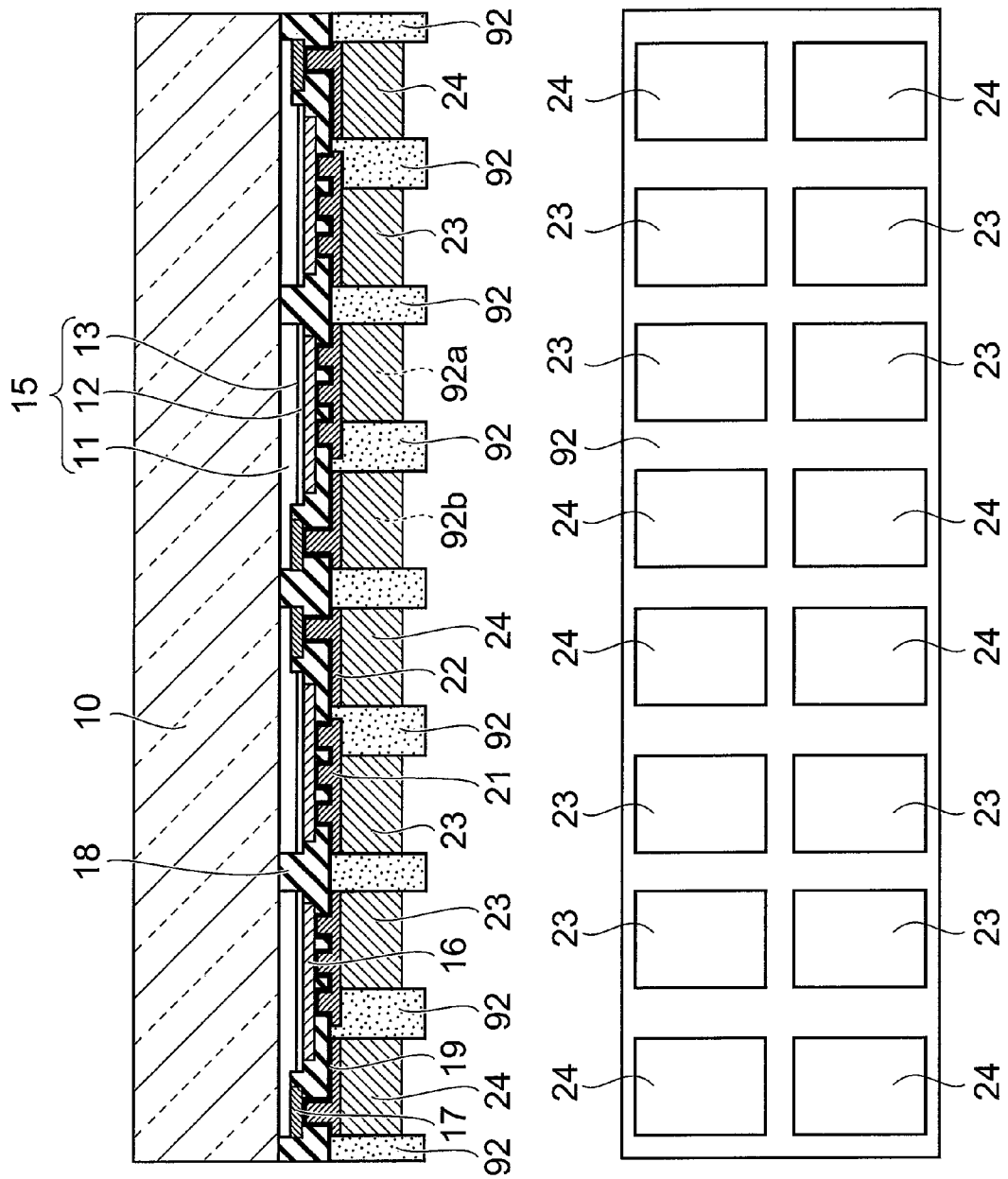

Further, a Cu electrolyte plating using the metal film 19 as a current route is carried out by using the resist 92 as a mask. Accordingly, as shown in FIG. 11A and FIG. 11B corresponding to a bottom elevational view thereof, the p-side metal pillar 23 and the n-side metal pillar 24 are formed.

The p-side metal pillar 23 is formed on the surface of the p-side interconnection layer 21 within the first opening 92a which is formed in the resist 92. The n-side metal pillar 24 is formed on the surface of the n-side interconnection layer 22 within the second opening 92b which is formed in the resist 92. The p-side metal pillar 23 and the n-side metal pillar 24 are simultaneously formed in accordance with the plating method and are configured, for example, by the copper material.

Figure 12A:
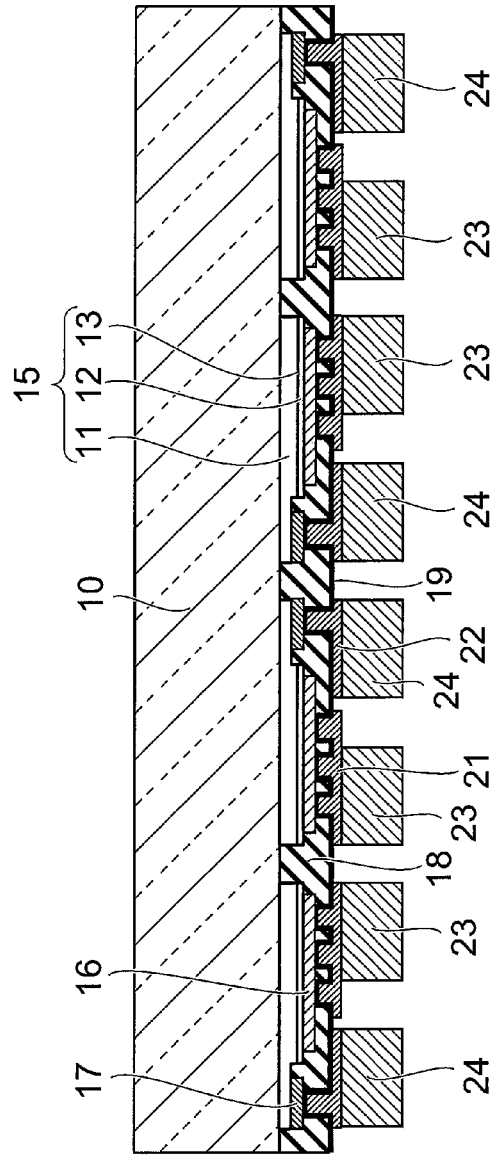
Figure 12B:
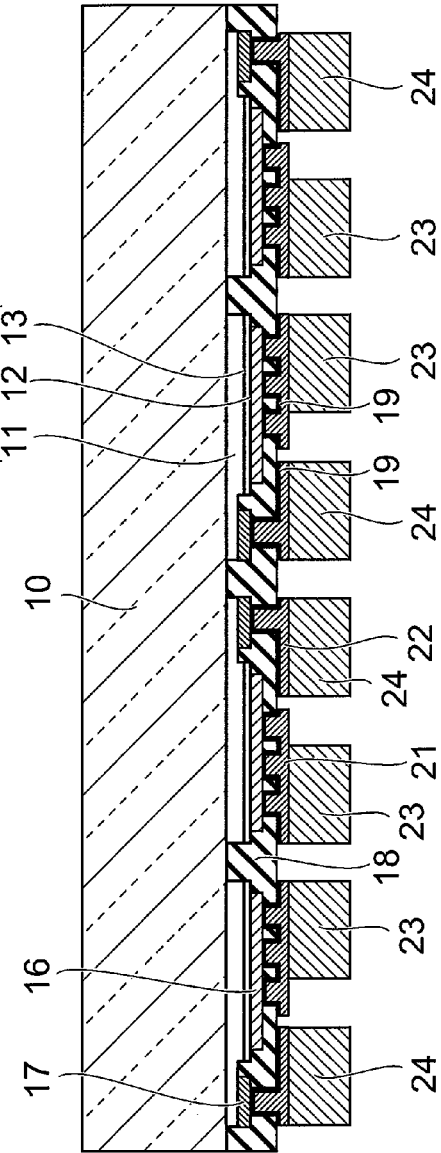

The resist 92 is removed, for example, by using a solvent or an oxide plasma, as shown in FIG. 12A. Thereafter, an exposed portion of the metal film 19 is removed in accordance with a wet etching by using the metal pillar 23, the n-side metal pillar 24, the p-side interconnection layer 21 and the n-side interconnection layer 22 as the mask. Accordingly, as shown in FIG. 12B, the electric connection between the p-side interconnection layer 21 and the n-side interconnection layer 22 via the metal film 19 is segmented.

Next, as shown in FIG. 13A, the resin layer 25 is stacked with respect to the insulating film 18. The resin layer 25 covers the p-side interconnection layer 21, the n-side interconnection layer 22, the p-side metal pillar 23 and the n-side metal pillar 24.

The resin layer 25 has an insulating property. Further, the resin layer 25 may be provided with a light shielding property against the luminescent light of the light emitting layer 13, for example, by including a carbon black.

Next, as shown in FIG. 13B, the substrate 10 is removed. In the case that the substrate 10 is the sapphire substrate, the substrate 10 can be removed, for example, in accordance with a laser liftoff method. Specifically, a laser light is irradiated from the back face side of the substrate 10 toward the first semiconductor layer 11. The laser light has a transparency with respect to the substrate 10, and has a wavelength which comes to an absorption region with respect to the first semiconductor layer 11.

If the laser light reaches an interface between the substrate 10 and the first semiconductor layer 11, the first semiconductor layer 11 in the vicinity of the interface absorbs an energy of the laser light so as to be decomposed. The first semiconductor layer 11 is decomposed into the gallium (Ga) and the nitrogen gas. In accordance with the decomposing reaction, a micro gap is formed between the substrate 10 and the first semiconductor layer 11, and the substrate 10 and the first semiconductor layer 11 are separated.

An irradiation of the laser light is carried out over a whole wafer a plurality of times per a set region, thereby removing the substrate 10.

In the case that the substrate 10 is the silicon substrate, the substrate 10 can be removed in accordance with an etching.

Since the stacked body mentioned above which is formed on the main face of the substrate 10 is reinforced by the p-side metal pillar 23, the n-side metal pillar 24 and the resin layer 25 which are thicker than the semiconductor layer 15, it is possible to keep a wafer state even if the substrate 10 runs short.

Further, the resin layer 25, and the metal which configures the p-side metal pillar 23 and the n-side metal pillar 24 are flexible materials in comparison with the semiconductor layer 15. The semiconductor layer 15 is supported by the flexible support body mentioned above. Therefore, even if a great internal stress which is generated at a time of epitaxial growing the semiconductor layer 15 on the substrate 10 is released at a stroke at a time of peeling the substrate 10, it is possible to avoid the semiconductor layer 15 from being broken.

The first face 15a of the semiconductor layer 15 from which the substrate 10 is removed is washed. For example, the gallium (Ga) attached to the first face 15a is removed by a dilute hydrofluoric acid or the like.

Thereafter, for example, the first face 15a is wet etched by a potassium hydroxide (KOH) water solution, a tetramethyl ammonium hydroxide (TMAH) or the like. Accordingly, the concavities and convexities are formed on the first face 15a corresponding to a difference of an etching speed which depends on a crystal face direction. Alternatively, the concavities and convexities may be formed on the first face 15a by carrying out an etching after patterning by the resist. Since the concavities and convexities are formed on the first face 15a, it is possible to improve a light pickup efficiency.

Next, the surface (the lower face in FIG. 13B) of the resin layer 25 is ground, and the p-side external terminal 23a and the n-side external terminal 24a are exposed from the resin layer 25.

Figure 14A:
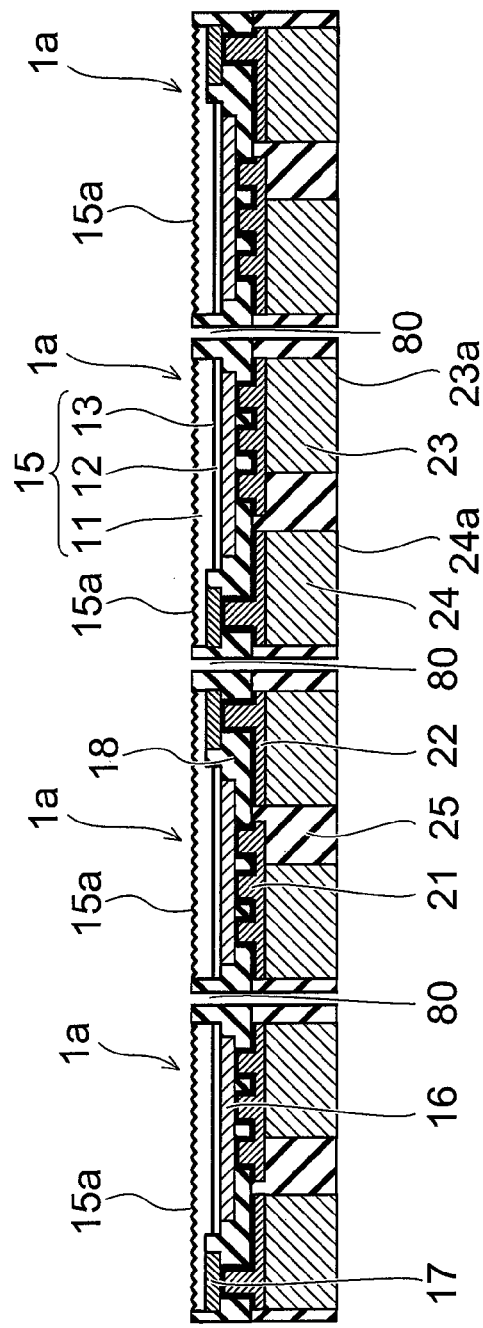
Figure 14B:
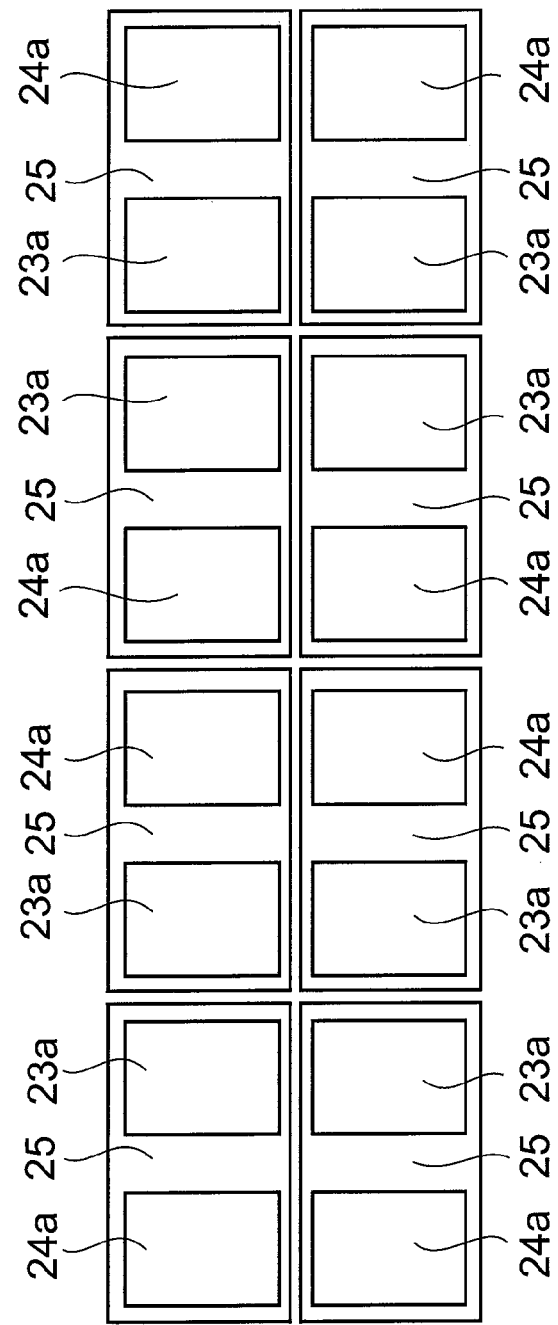

Thereafter, as shown in FIG. 14A and FIG. 14B corresponding to a bottom elevational view thereof, the insulating film 18 and the resin layer 25 are cut at a position of the groove 80 mentioned above into a plurality of light emitting chips 1a. For example, it is cut by using a dicing blade. Alternatively, it may be cut in accordance with a laser irradiation.

At a time of dicing, the substrate 10 has been already removed. Further, since the semiconductor layer 15 does not exist in the groove 80, it is possible to avoid a damage which the semiconductor layer 15 is exposed at a time of dicing. Further, it is possible to obtain a configuration in which the end portion (the side face) of the semiconductor layer 15 is covered by the insulating film 18 so as to be protected, without any additional process after segmenting.

In this case, the segmented light emitting chip 1a may be a single chip configuration including one semiconductor layer 15, or a multi chip configuration including a plurality of semiconductor layers 15.

Since each of the processes mentioned above before being diced is carried out in a lump in a wafer state, it is not necessary to carry out a interconnection and a packaging per the segmented individual device, and it is possible to widely reduce a manufacturing cost. In other words, the interconnection and the packaging are finished already in the segmented state. Accordingly, it is possible to enhance a productivity. As a result, it is easy to reduce a cost.

As shown in FIG. 1A, the segmented individual light emitting chip 1 is mounted on the mounting substrate 200. As mentioned above, the p-side external terminal 23a and the n-side external terminal 24a are bonded to a pad 202, for example, by a solder 203.

After mounting the light emitting chip 1, the transparent layer 40 is formed on the mounting face 201. In the case that the first transparent body 41 of the transparent layer 40 is configured by a resin material, the transparent layer 40 can be formed by supplying a liquid resin into which the scattering agent 41 is dispersed onto the mounting face 201, and thereafter hardening.

The top face of the transparent layer 40 is formed flat, and the phosphor layer 30 is formed thereon. In the case that the second transparent body 31 of the phosphor layer 30 is configured by the resin material, a liquid resin into which the phosphor 32 is dispersed is supplied onto the transparent layer 40, for example, in accordance with a method such as a printing, a potting, a molding, a compression molding or the like, and is thereafter thermally hardened.

Alternatively, the film-shaped phosphor layer 30 may be attached to the top face of the transparent layer 40. Since the top face of the transparent layer 40 is flat, the phosphor layer 30 can be easily attached closely to the transparent layer 40 while holding the gap between the transparent layer 40 and the phosphor layer 30.

For example, in the case of forming the liquid resin into which the phosphor is dispersed, in accordance with the printing method, a viscosity of the phosphor including liquid resin is between 5000 and 10000 (cP), which is comparatively high, and there is a risk that an unfilled portion (a void) of the phosphor layer is formed between the chips, depending on the magnitude of the gap between the chips. The void (a gap) generated between the chips may cause a peeling, a foam, and an irregular color of the phosphor layer.

On the contrary, in accordance with the embodiment, the transparent layer 40 which does not include the phosphor is filled in place of the phosphor layer, between the light emitting chips 1. The transparent layer 40 which does not include the phosphor is lower in a viscosity than the phosphor layer 30. Accordingly, in order to achieve a high power density by the high density mounting, the transparent layer 40 may be filled between the chip gaps without generating any void, even in the case that the gap between the light emitting chips 1 is narrow.

Further, the transparent layer 40 includes the scattering agent 42. The luminescent light (the excited light) of the light emitting chip 1 is scattered by the scattering agent 42 in the transparent layer 40, and it is possible to widen a light distribution angle of the excited light.

In the light emitting chip 1a shown in FIG. 3A, the insulating film 18 provided in the side face of the semiconductor layer 15 has a transparency with respect to the luminescent light of the light emitting layer 13, and the light is emitted from the side face of the semiconductor layer 15.

Since the scattering agent 42 is dispersed into the transparent layer 40 between a plurality of light emitting chips 1, the light emitted from the side face of the light emitting chip 1 is scattered by the scattering agent 42. Accordingly, in the light emitting module 100, it is possible to increase the excited light to the above (the phosphor layer 30 side) of the portion in which the light emitting chip 1 is not mounted.

In other words, it is possible to uniformize the distribution in the face direction of the intensity of the excited light which enters into the phosphor layer 30, by the transparent layer 40 which is mounted between the light emitting chips 1 and on the light emitting chip 1 and includes the scattering agent 42. Accordingly, it is possible to make the configuration body configured by a plurality of light emitting chips 1 and the transparent layer 40 covering them emit uniformly in the face direction as if it is a single chip. Since the uniform light enters into the phosphor layer 30, it is possible to suppress an irregular color in the face direction which is in parallel to the mounting face 201.

Further, since the top face of the transparent layer 40 is flat, it is possible to make the thickness of the phosphor layer 30 provided on the flat face uniform. Accordingly, it is possible to suppress an irregular color caused by a thickness dispersion of the phosphor layer 30.

A size (an average grain diameter) of the scattering agent 42 is smaller than the emission wavelength of the light emitting layer 13. For this reason, the excited light Rayleigh scatters in the transparent layer 40. In the Rayleigh scattering, since a scattering intensity is in inverse proportion to a biquadrate of the wavelength, the light becomes a light scattering having a wavelength dependency in which the scattering intensity becomes stronger toward the shorter wavelength. Therefore, it is easy to scatter the blue light which is emitted from the light emitting layer 13 which is the GaN material.

Figure 1B:
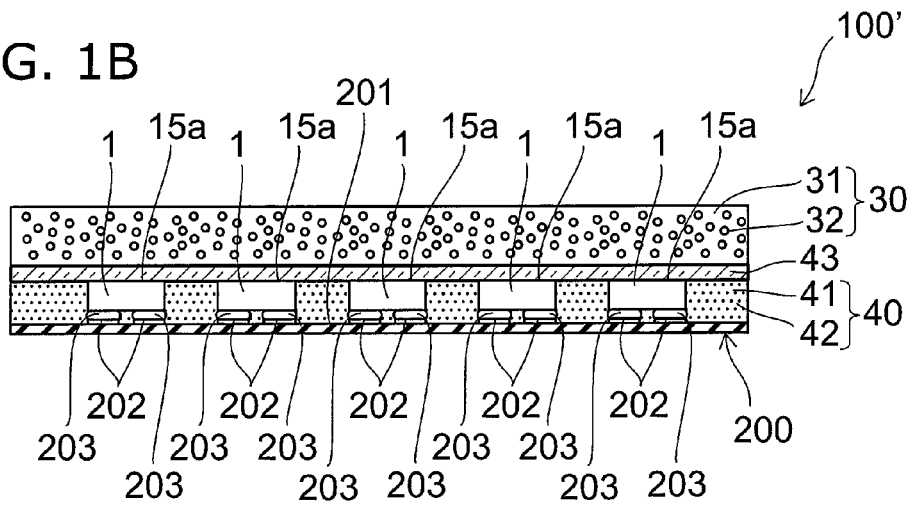
Figure 1C:
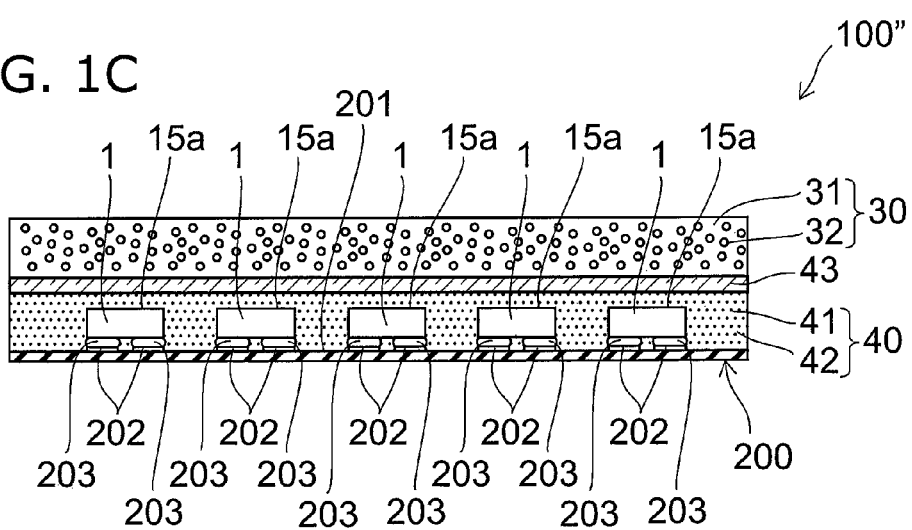

The transparent layer is not limited to a single layer configuration, but may be a stacked configuration having a plurality of layers such as a light emitting module 100' shown in FIG. 1B, or a light emitting module 100" shown in FIG. 1C.

In the light emitting module 100' shown in FIG. 1B, another transparent layer 43 is provided on the transparent layer 40.

The transparent layer 40 is the same as the transparent layer 40 in the light emitting module 100 of the embodiment mentioned above, has a first transparent body 41 and a scattering agent 42 which is dispersed into the first transparent body 41, and is filled between a plurality of light emitting chips 1.

The transparent layer 40 is not provided on the light emitting chip 1, but a transparent layer 43 which does not include the scattering agent is provided. The transparent layer 43 has a transparency with respect to the luminescent light of the light emitting chip 1 (the luminescent light of the light emitting layer 13), and is a transparent resin, for example, a silicone resin, an epoxy resin or the like. The transparent layer 43 mainly performs an adhesion to the phosphor layer 30.

The top face of the transparent layer 40 and the top face of the light emitting chip 1 configure a flat face which has the same height from the mounting face 201. Further, the top face of the transparent layer 43 which is provided on the top face of the transparent layer 40 and on the top face of the light emitting chip 1 is flat. Accordingly, it is possible to form the phosphor layer 30 on the flat face of the transparent layer 43, and it is easy to make the film thickness of the phosphor layer 30 uniform.

Even in the light emitting module 100' shown in FIG. 1B, since the scattering agent 42 is dispersed into the transparent layer 40 between a plurality of light emitting chips 1, the light emitted from the side face of the light emitting chip 1 is scattered by the scattering agent 42. Accordingly, in the light emitting module 100', it is possible to increase the excited light to above the portion (the side of the phosphor layer 30) in which the light emitting chip 1 is not mounted. As a result, it is possible to achieve a uniformization of the distribution in the face direction of the intensity of the excited light which enters into the phosphor layer 30, and it is possible to suppress the irregular color.

Further, such as the light emitting module 100" shown in FIG. 1C, the transparent layer 43 which does not include the scattering agent may be provided on the transparent layer 40, after providing the transparent layer 40 including the scattering agent 42 on the light emitting chip 1. In this case, it is possible to form the phosphor layer 30 on the flat face of the transparent material layer 43.

Figure 15A:
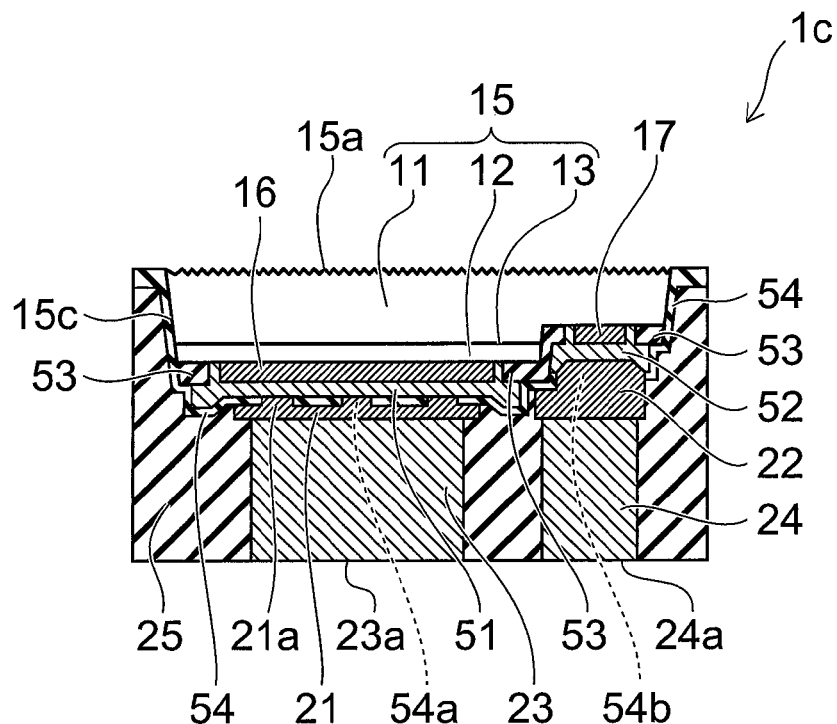
FIGS. 15A and 15B are schematic cross-sectional views of a light emitting chip of another embodiment.

FIG. 15A is a schematic cross sectional view of a light emitting chip 1c according to the other embodiment.

The light emitting chip 1c is provided with a p-side pad 51 which covers the p-side electrode 16, on the surface and the side face of the p-side electrode 16. The p-side electrode 16 includes a material which can form an alloy together with the gallium (Ga) included in the semiconductor material layer 15, for example, at least one of a nickel (Ni), a gold (Au) and a rhodium (Rh). The p-side pad 51 is higher in a reflectance with respect to the luminescent light of the light emitting layer 13 than the p-side electrode 16, and includes, for example, a silver (Ag) as a main component. Further, the p-side pad 51 protects the p-side electrode 16 from an oxidation and a corrosion.

Further, an n-side pad 52 which covers the n-side electrode 17 is provided on the surface and the side face of the n-side electrode 17. The n-side electrode 17 includes a material which can form an alloy together with the gallium (Ga) included in the semiconductor layer 15, for example, at least one of the nickel (Ni), the gold (Au) and the rhodium (Rh). The n-side pad 52 is higher in its reflectance with respect to the luminescent light of the light emitting layer 13 than the n-side electrode 17, and includes, for example, the silver (Ag) as a main component. Further, the n-side pad 52 protects the n-side electrode 17 from the oxidation and the corrosion.

An insulating film 53, for example, a silicon oxide film, a silicon nitride film or the like is provided around the p-side electrode 16 and around the n-side electrode 17 in the second face of the semiconductor layer 15. The insulating film 53 is provided between the p-side electrode 16 and the n-side electrode 17, and between the p-side pad 51 and the n-side pad 52.

An insulating film 54, for example, a silicon oxide film, a silicon nitride film or the like is provided on the insulating film 53, on the p-side pad 51 and on the n-side pad 52. Further, the insulating film 54 is provided in the side face 15c of the semiconductor layer 15, and covers the side face 15c.

The p-side interconnection layer 21 and the n-side interconnection layer 22 are provided on the insulating film 54. The p-side interconnection layer 21 is connected to the p-side pad 51 through a first opening 54a which is formed in the insulating film 54. The n-side interconnection layer 22 is connected to the n-side pad 52 through a second opening 54b which is formed in the insulating film 54.

In this configuration, the p-side interconnection layer 21 may be connected to the p-side pad 51 via a plurality of vias 21a as shown in the drawing, or may be connected to the p-side pad 51 through one post which is larger in its plane size than the via 21a.

A p-side metal pillar 23 which is thicker than the p-side interconnection layer 21 is provided on the p-side interconnection layer 21. An n-side metal pillar 24 which is thicker than the n-side interconnection layer 22 is provided on the n-side interconnection layer 22.

The resin layer 25 is stacked with respect to the insulating film 54. The resin layer 25 covers the p-side interconnection portion which includes the p-side interconnection layer 21 and the p-side metal pillar 23, and the n-side interconnection portion which includes the n-side interconnection layer 22 and the n-side metal pillar 24. In this case, a face (a lower face in the drawing) in an opposite side to the p-side interconnection layer 21 in the p-side metal pillar 23 is exposed from the resin layer 25, and serves as the p-side external terminal 23a. In the same manner, a face (a lower face in the drawing) in an opposite side to the n-side interconnection layer 22 in the n-side metal pillar 24 is exposed from the resin layer 25, and serves as the n-side external terminal 24a.

The resin layer 25 is filled in the groove 80 via the insulating film 54, the groove 80 separating the semiconductor layer 15 into a plurality of sections on the substrate 10. Accordingly, the side face 15c of the semiconductor layer 15 is covered by the insulating film 54 corresponding to the inorganic film, and the resin layer 25 so as to be protected.

In the same manner as the embodiment mentioned above, the p-side interconnection layer 21, the n-side interconnection layer 22, the p-side metal pillar 23 and the n-side metal pillar 24 can be formed in accordance with a plating method. The metal film 19 which is used as the seed metal at a time of plating is left as the foundation of the p-side interconnection layer 21 and the n-side interconnection layer 22, as shown in FIG. 15B. Further, the metal film 19 is left in the side face of the insulating film 54 which covers the side face 15c of the semiconductor layer 15.

Figure 15B:
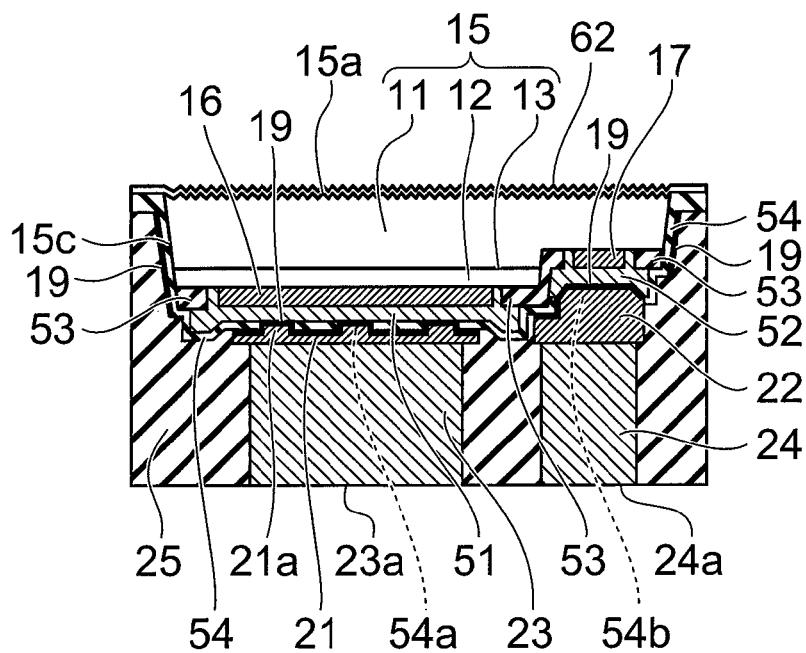

Further, as shown in FIG. 15B, the first face 15a may be provided with an inorganic film 62, for example, a silicon oxide film, a silicon nitride film, a silicon oxynitride film, a spin on glass (SOG) film or the like.

The inorganic film 62 has a refraction index between a gallium nitride which is used in the semiconductor layer 15, and an air. The inorganic film 62 has a transparency with respect to the light which is discharged out of the light emitting lager 13.

The inorganic film 62 is provided in a conformal manner along the concavities and convexities of the first face 15a, and concavities and convexities reflected on the concavities and convexities of the first face 15a are formed on a surface of the inorganic film 62.

It is possible to prevent a refraction index of a medium from being largely changed in the pickup direction of the light through the first face 15a, by providing the inorganic film 62 having the refraction index between the gallium nitride and the air on the first face 15a including the gallium nitride, whereby it is possible to improve a light pickup efficiency.

Next, a description will be given of an array on the mounting substrate 200 of a plurality of light emitting chips 1.

Figure 2A:
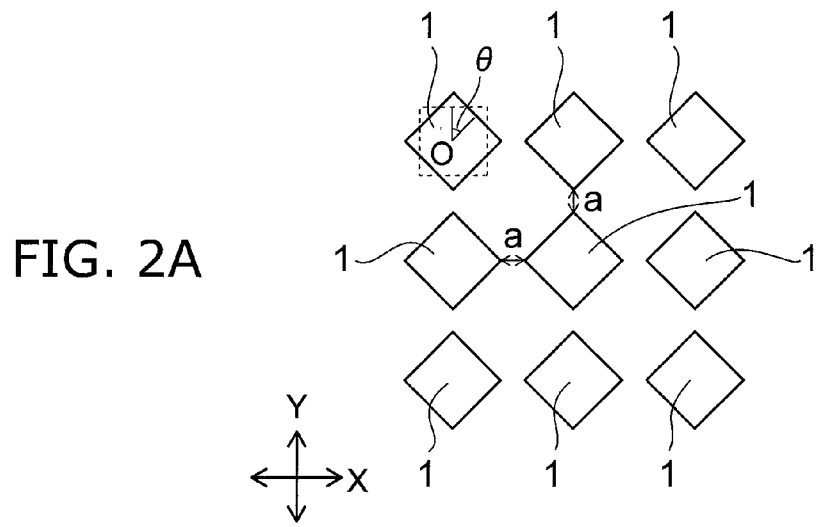
FIGS. 2A to 2C are schematic plan views of layouts of a plurality of light emitting chips of the light emitting module of the embodiment.
Figure 2B:
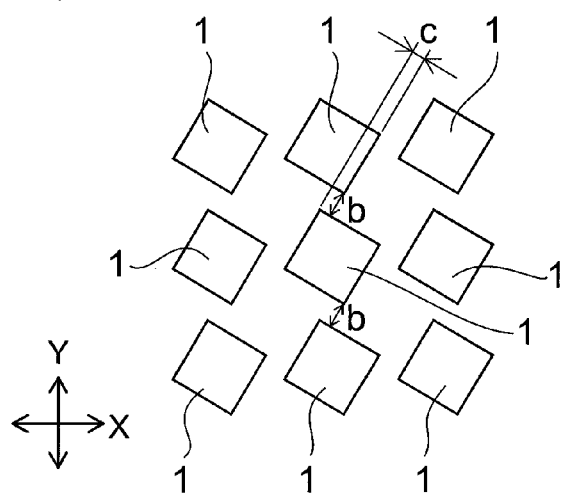

FIGS. 2A and 2B are schematic plan views of a plurality of light emitting chips 1 which are mounted on the mounting substrate 200 as seen from a side of the first face 15a.

The light emitting chip 1 is formed as a rectangular shape which has four corner portions (apex portions) and four sides, in a plan view as seen from the side of the first face 15a.

In accordance with the array shown in FIG. 2A, a portion which is opposed to the adjacent chip 1 being spaced at a shortest distance a is the corner portion (the apex portion). Accordingly, in the chip 1, a portion which is opposed to the adjacent chip 1 being spaced at the shortest distance a is a point, and a size thereof is shorter than a length of one side of the chip 1.

Further, in accordance with the array shown in FIG. 2B, a portion which is opposed to the adjacent chip 1 being spaced at a shortest distance b is a part of the side of the chip 1. Accordingly, in the chip 1, a length c in the plan view of the portion which is opposed to the adjacent chip 1 being spaced at the shortest distance b is shorter than the length of one side of the chip 1.

In accordance with the array of FIGS. 2A and 2B, not all the portions of one side of the chip 1 is opposed at the shortest distance with respect to the adjacent chip 1. In other words, in accordance with the array in FIGS. 2A and 2B, a part of the corner portion or one side of the chip 1 is opposed, in the portion in which the distance to the adjacent chip 1 is the shortest. Accordingly, the outgoing light from the side face of the chip 1 is hard to be obstructed by the side face of the adjacent chip 1, and it becomes possible to enhance a radiation efficiency to the upper portion in which the phosphor layer 30 is provided.

Figure 2C:
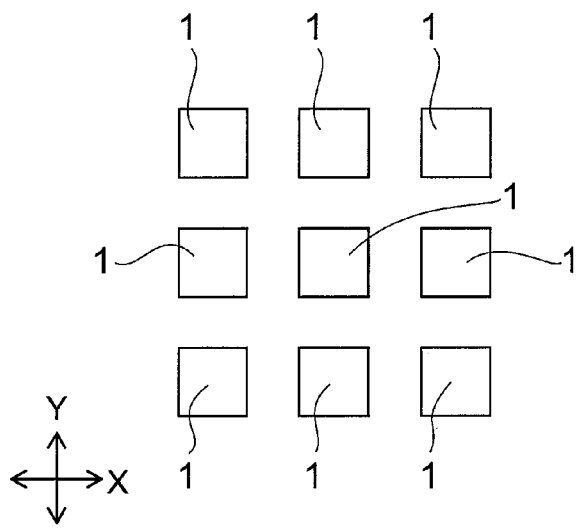

FIG. 2C shows a layout of a plurality of chips 1 which are disposed in all directions (in a matrix shape) along an X-axis direction and a Y-axis direction which are orthogonal on the plan view seeing the first face 15a. The chip array in FIGS. 2A and 2B can be obtained by rotating each of the chips 1 in the layout in FIG. 2C around the center of the chip 1 as a center of rotation at an angle θ and within an XY plane.

For example, the chip layout in FIG. 2A can be obtained by rotating the chip in FIG. 2C which is shown in an overlapping manner by a broken line, around a chip center o as a center of rotation in a clockwise direction at angle θ (for example, 45 degree). The angle θ can be optionally set.

In the embodiment mentioned above, the p-side interconnection layer 21 and the n-side interconnection layer 22 may be bonded to the pad 202 of the mounting substrate 200 without providing the p-side metal pillar 23 and the n-side metal pillar 24.

Further, the p-side interconnection layer 21 and the p-side metal pillar 23 are not limited to be the separate bodies, but the p-side interconnection portion may be configured by integrally forming the p-side interconnection layer 21 and the p-side metal pillar 23 in the same process. In the same manner, the n-side interconnection layer 22 and the n-side metal pillar 24 are not limited to be the separate bodies, but the n-side interconnection portion may be configured by integrally forming the n-side interconnection layer 22 and the n-side metal pillar 24 in the same process.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A light emitting module, comprising:
a mounting substrate having a mounting face, and a pad provided on the mounting face;
a plurality of light emitting chips mounted on the mounting face such that adjacent light emitting chips in the plurality are spaced from each other by a first distance;
a transparent layer provided between the plurality of light emitting chips, the transparent layer not including a phosphor, and having a first transparent body and a scattering agent that is dispersed in the first transparent body, the scattering agent having a different refraction index from a refraction index of the first transparent body, the transparent layer spanning the first distance between adjacent light emitting chips in the plurality; and
a phosphor layer provided on the transparent layer, and having a second transparent body and a phosphor dispersed into the second transparent body,
each light emitting chip including:
a semiconductor layer having a first face, a second face opposite to the first face, and a light emitting layer;
a p-side electrode provided on the second face in a region of the semiconductor layer including the light emitting layer;
an n-side electrode provided on the second face in a region of the semiconductor layer not including the light emitting layer;
a p-side external terminal provided between the p-side electrode and the pad, and electrically connected to the p-side electrode and the pad; and
an n-side external terminal provided between the n-side electrode and the pad, and electrically connected to the n-side electrode and the pad,
the first transparent body and the scattering agent of the transparent layer being provided between the plurality of light emitting chips and covering the first face of the semiconductor layer of each light emitting chip.

2. The module according to claim 1, wherein the transparent layer completely fills any spacing between the plurality of light emitting chips, and the phosphor layer is not provided in the spacing between the plurality of light emitting chips.

3. The module according to claim 1, wherein a top face of the transparent layer is flat.

4. The module according to claim 1, wherein a size of the scattering agent is smaller than a emission wavelength of the light emitting layer.

5. The module according to claim 1, wherein each light emitting chip has a rectangular shape in a plan view, as seen from the first face side, and
the plurality of light emitting chips is arranged such that a facing portion of each light emitting chip is less than a full length of any side of the light emitting chip including the facing portion, the facing portion being that portion of the light emitting chip that is spaced from any adjacent light emitting chip by the first distance.

6. The module according to claim 5, wherein the facing portion of each light emitting chip is a corner portion.

7. The module according to claim 5, wherein the facing portion of each light emitting chip extends along a side of each light emitting chip.

8. The module according to claim 1, wherein the light emitting chip further includes
a first insulating film provided on a side of the second face, and having a first opening communicating with the p-side electrode and a second opening communicating with the n-side electrode;
a p-side interconnection portion provided on the first insulating film and electrically connected to the p-side electrode through the first opening, the p-side interconnection portion having the p-side external terminal; and
an n-side interconnection portion provided on the first insulating film and electrically connected to the n-side electrode through the second opening, n-side interconnection portion having the n-side external terminal.

9. The module according to claim 8, wherein the first insulating film covers a side face that extends from the first face of the semiconductor layer.

10. The module according to claim 9, wherein the first insulating film has a transparency with respect to light emitted from the light emitting layer.

11. The module according to claim 8, wherein the light emitting chip further includes a second insulating film provided between the p-side interconnection portion and the n-side interconnection portion.

12. The module according to claim 11, wherein the second insulating film covers a periphery of the p-side interconnection portion and a periphery of the n-side interconnection portion.

13. The module according to claim 8, wherein
the p-side interconnection portion includes
a p-side interconnection layer provided inside the first opening and on the first insulating film; and
a p-side metal pillar provided on the p-side interconnection layer, being thicker than the p-side interconnection layer, and having the p-side external terminal, and
the n-side interconnection portion include
an n-side interconnection layer provided inside the second opening and on the first insulating film; and
an n-side metal pillar provided on the n-side interconnection layer, being thicker than the n-side interconnection layer, and having the n-side external terminal.

14. The module according to claim 1, wherein the light emitting chip further include a second transparent layer provided on the first face.

15. The module according to claim 1, wherein the transparent layer has a stacked configuration of a plurality of transparent layers.

16. The module according to claim 15, wherein the plurality of transparent layers includes a transparent layer which is provided on the light emitting chip, and does not include the scattering agent.

17. The module according to claim 1, wherein the light emitting chip further includes an inorganic film provided on the first face, and having a transparency with respect to light emitted from the light emitting layer.

18. The module according to claim 17, wherein the inorganic film has a refraction index which is between a refraction index of the semiconductor layer and a refraction index of an air.

19. The module according to claim 1, wherein the transparent layer directly contacts each adjacent light emitting chip.

* * * * *